United States Patent
Yano et al.

(10) Patent No.: US 6,332,724 B1
(45) Date of Patent: Dec. 25, 2001

(54) SUBSTRATE PROCESSING APPARATUS

(75) Inventors: Mitsuteru Yano; Norio Semba; Kouzou Kanagawa; Issei Ueda; Masami Akimoto, all of Kumamoto-Ken; Kazuhiko Ohi, Kawasaki, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/653,162

(22) Filed: Sep. 1, 2000

(30) Foreign Application Priority Data

Sep. 3, 1999 (JP) .................................................. 11-250092
Sep. 3, 1999 (JP) .................................................. 11-250093

(51) Int. Cl.$^7$ ............................. H01L 21/027; G03D 5/04
(52) U.S. Cl. ............................. 396/611; 396/327; 118/69; 118/52; 134/902; 355/30
(58) Field of Search .................................... 396/579, 604, 396/611, 627; 118/52, 54, 56, 319–321, 500, 666–668, 300, 326, 69; 134/2, 3, 24, 34, 157, 902; 355/27, 30

(56) References Cited

U.S. PATENT DOCUMENTS

| | | | |
|---|---|---|---|
| 5,143,552 | * 9/1992 | Moriyama | 118/666 |
| 5,944,894 | 8/1999 | Kitano et al. | |
| 6,063,439 | * 5/2000 | Semba et al. | 427/240 |

FOREIGN PATENT DOCUMENTS

| | | |
|---|---|---|
| 11-270891 | 10/1999 | (JP) . |
| 2000-150360 | 5/2000 | (JP) . |

\* cited by examiner

Primary Examiner—Alan A. Mathews
(74) Attorney, Agent, or Firm—Rader, Fishman & Grauer, PLLC

(57) ABSTRACT

Outside air taken in from the outside is cooled to a predetermined temperature by a cooler, and the air cooled by the cooler flows through a low temperature side flow path in a heat exchanger, whereas outside air flows through a high temperature side flow path in the heat exchanger, which allows heat to be exchanged between the cooled air and the outside air. The air, flowing through the low temperature side flow path in the heat exchanger and warmed up by the outside air flowing through the high temperature side flow path, is warmed and humidified by a warmer and a humidifier, and the air with predetermined temperature and humidity is supplied to a coating processing unit. Moreover, the outside air, flowing through the high temperature side flow path in the heat exchanger and cooled by the air flowing through the low temperature side flow path, is warmed by a warmer, and the air with a predetermined temperature is supplied to a developing processing unit. Thus, an apparatus for regulating the temperature and humidity of air to be supplied to the coating processing unit and the developing processing unit can be downsized, and running costs for electric power consumption and the like can be reduced.

19 Claims, 15 Drawing Sheets

SUBSTRATE PROCESSING APPARATUS

BACKGROUND OF THE INVENTION

1. Field of the Invention

The present invention relates to a substrate processing apparatus for performing coating and developing processing for substrates such as semiconductor wafers or the like to fabricate semiconductors, and in more detail, relates to a substrate processing apparatus capable of controlling the temperature and humidity of air to be supplied to a resist coating processing unit and a developing processing unit.

2. Description of the Related Art

In the process of fabricating a semiconductor device, there is a series of processing steps of coating a semiconductor wafer which is a substrate to be processed with a photo-resist solution, reducing a circuit pattern or the like in size and exposing a photo-resist film by means of photolithography, and performing developing processing. These processing steps are extremely important to high integration of the semiconductor device.

In these processing steps, the semiconductor wafer which has undergone cleaning processing is first subjected to hydrophobic processing in an adhesion processing unit and cooled in a cooling processing unit, and thereafter a photo-resist film is formed by coating in a resist coating processing unit. The semiconductor wafer on which the photo-resist film is formed is subjected to pre-bake processing in a hot plate unit, cooled in a cooling processing unit, and then exposed in accordance with a predetermined pattern in an aligner. Subsequently, the exposed semiconductor wafer is subjected to post-exposure bake processing and cooled in a cooling processing unit, and a developing solution is applied and the exposed pattern is developed in a developing unit. Finally, the semiconductor wafer is subjected to post-bake processing in the hot plate unit.

Out of such a series of processing steps, the steps except exposure processing are performed by a resist coating and developing processing system into which these processing units are integrated.

In the aforesaid resist coating processing unit, the influence of temperature and humidity upon the precision of film thickness of a resist film formed after a resist solution is applied is large, and hence it is necessary to precisely control the temperature and humidity of air inside a cup in this coating processing unit.

In the developing processing unit, line width accuracy is greatly influenced by the temperature of a developing solution, and therefore it is required to precisely control the temperature of air inside a cup in the developing unit.

From these respects, conventionally, air of which the temperature and humidity are strictly controlled at predetermined values is supplied into the cups in the coating processing unit and the developing processing unit, and the control of temperature and humidity is performed integrally.

In a temperature and humidity controller used on this occasion, outside air (for example, a temperature of 23° C., a relative humidity of 45%) outside the resist coating and developing processing system is taken into a cooler and cooled to a temperature (for example, 7° C., 95% to 100%) not more than a dew-point temperature, then warmed to a predetermined temperature (for example, 23° C.) by a warmer, and thereafter humidified by a humidifier and regulated at predetermined temperature and humidity (for example, 23° C., 40% to 50%). The air regulated as above is then supplied to a coating processing unit (COT) and a developing processing unit (DEV) respectively.

The reason why after temporarily being cooled in the cooler, outside air is warmed by the warmer and humidified by the humidifier, and thereby the temperature and humidity thereof are regulated is that the regulation of the temperature and humidity of air to be supplied to the coating processing unit (COT) is required.

Namely, the relative humidity of air reaches almost 100% by temporarily cooling outside air to a temperature not more than the dew-point temperature by the cooler, but moisture contained in the air is removed (dehumidified) by condensing it into dewdrops, thereby reducing the absolute amount of moisture contained in unit volume of air, and thereafter the air is warmed to a predetermined temperature by the warmer and humidified to a predetermined humidity by the humidifier.

Accordingly, there is a problem that all the air taken in needs to be heated after being cooled temporarily, which causes a sudden rise in running cost for electric power consumption and the like.

Another problem is that there is the possibility that the temperature of air changes while the air reaches the coating processing unit even if the temperature and humidity are controlled as described above. Furthermore, equipment including such cooler, warmer, and humidifier as described above is necessary to control the temperature and humidity of air to be supplied to the coating processing unit, but there is a problem that such equipment needs to be simplified to the utmost to thereby hold down running costs for electric power consumption and the like.

SUMMARY OF THE INVENTION

The present invention is made to solve these problems, and an object of the present invention is to provide a substrate processing apparatus capable of reducing running coats for electric power consumption by a device for regulating the temperature and humidity of air to be supplied to a coating processing unit and a developing processing unit.

Another object of the present invention is to provide a substrate processing apparatus capable of supplying air of which the temperature and humidity are controlled precisely to a processing unit.

To attain these objects, according to a first aspect of the present invention, a substrate processing apparatus, comprising: a coating processing unit for applying a resist solution to a substrate; a developing processing unit for performing developing processing for the substrate after the applied resist film is exposed; a cooling section for cooling outside air taken in from the outside to a predetermined temperature; a heat exchanger having a low temperature side flow path for letting the air cooled in the cooling section flow and a high temperature side flow path for letting outside air flow, and allowing heat exchange to be performed between the cooled air and the outside air; a warming and humidifying section for warming and humidifying the air flowing through the low temperature side flow path in the heat exchanger and warmed by the outside air flowing through the high temperature side flow path, and supplying the air with predetermined temperature and humidity to the coating processing unit; and a warming section for warming the outside air flowing through the high temperature side flow path in said heat exchanger and cooled by the air flowing through the low temperature side flow path, and supplying the air with a predetermined temperature to the developing processing unit, is provided.

According to the aforesaid structure, air, which is temporarily cooled by the cooling section and then warmed up by the heat exchanger, and thereafter the temperature and humidity of which are regulated by the warming and humidifying section, is supplied to the coating processing unit which requires temperature and humidity regulation of air to be supplied. Meanwhile, without being cooled by the cooling section, air, the temperature of which is slightly lowered by the heat exchanger and thereafter regulated by the warming section, is supplied to the developing processing unit which needs only temperature regulation of air and does not need humidity regulation. Therefore, the cooling section cools only the air to be supplied to the coating processing unit and does not the cool air to be supplied to the developing processing unit, whereby the amount of air to be cooled can be made smaller than in the prior arts. For example, when the numbers of the coating processing units and the developing processing units are the same, the amount of air to be cooled can be halved compared with that in the prior arts. As described above, by paying attention to the point that the developing processing unit does not necessarily need humidity control, such structure that air to be supplied to the coating processing unit and air to be supplied to the developing processing unit are separated from the beginning, only the air to be supplied to the coating processing unit which requires humidity control is cooled by the cooling section, and that the air which has passed the cooling section is warmed by outside air to be supplied to the developing processing unit is given, whereby a mechanism for cooling can be downsized, and running costs for electric power consumption and the like can be reduced.

According to a second aspect of the present invention, a substrate processing apparatus, comprising: a first processing unit for processing a substrate; a second processing unit for processing the substrate; a cooling section for cooling outside air taken in from the outside to a predetermined temperature; a heat exchanger having a low temperature side flow path for letting the air cooled in the cooling section flow and a high temperature side flow path for letting outside air flow, and allowing heat exchange to be performed between the cooled air and the outside air; a warming and humidifying section for warming and humidifying the air flowing through the low temperature side flow path in the heat exchanger and warmed by the outside air flowing through the high temperature side flow path, and supplying the air with predetermined temperature and humidity to the first processing unit; and a warming section for warming the outside air flowing through the high temperature side flow path in the heat exchanger and cooled by the air flowing through the low temperature side flow path, and supplying the air with a predetermined temperature to the second processing unit, is provided.

According to the aforesaid structure, air, which is temporarily cooled by the cooling section and then warmed up by the heat exchanger, and thereafter the temperature and humidity of which are regulated by the warming and humidifying section, is supplied to the first processing unit which requires temperature and humidity regulation of air to be supplied. Meanwhile, without being cooled by the cooling section, air, the temperature of which is slightly lowered by the heat exchanger and thereafter regulated by the warming section, is supplied to the second processing unit which needs only temperature regulation of air and does not need humidity regulation. Therefore, the cooling section cools only the air to be supplied to the first processing unit and does not the cool the air to be supplied to the second processing unit, whereby the amount of air to be cooled can be made smaller than in the prior arts. For example, when the numbers of the first processing units and the second processing units are the same, the amount of air to be cooled can be halved, compared with that in the prior arts. Consequently, a mechanism for cooling can be downsized, and running costs for electric power consumption and the like can be reduced.

According to a third aspect of the present invention, a substrate processing apparatus, comprising: a first processing unit for processing a substrate; a second processing unit for processing the substrate; a cooling section for cooling air exhausted from the first processing unit to a predetermined temperature; a heat exchanger having a low temperature side flow path for letting the air cooled in the cooling section flow and a high temperature side flow path for letting air exhausted from the second processing unit flow, and allowing heat exchange to be performed between the cooled air and the air exhausted from the second processing unit; a warming and humidifying section for warming and humidifying the air flowing through the low temperature side flow path in the heat exchanger and warmed by the air exhausted from the second processing unit and flowing through the high temperature side flow path, and supplying the air with predetermined temperature and humidity to the first processing unit; and a warming section for warming the air exhausted from the second processing unit which is flowing through the high temperature side flow path in the heat exchanger and cooled by the air flowing through the low temperature side flow path, and supplying the air with a predetermined temperature to the second processing unit, is provided.

According to the aforesaid structure, air, which is temporarily cooled by the cooling section and then warmed up by the heat exchanger, and thereafter the temperature and humidity of which are regulated by the warming and humidifying section, is supplied to the first processing unit which requires temperature and humidity regulation of air to be supplied. Meanwhile, without being cooled by the cooling section, air, the temperature of which is slightly lowered by the heat exchanger and thereafter regulated by the warming section, is supplied to the second processing unit which needs only temperature regulation of air and does not need humidity regulation. Therefore, the cooling section cools only the air to be supplied to the first processing unit and does not cool the air to be supplied to the second processing unit, whereby the amount of air to be cooled can be made smaller than in the prior arts. Consequently, a mechanism for cooling can be downsized, and running costs for electric power consumption and the like can be reduced. Moreover, air exhausted respectively from the first processing unit and the second processing unit is reused for air to be supplied respectively to the first processing unit and the second processing unit. Since the temperature and humidity of exhausted air have values approximate to temperature conditions and humidity conditions of air to be supplied, energy required for regulating the exhausted air at desired temperature and humidity can be further held down.

According to a fourth aspect of the present invention, a substrate processing apparatus, comprising: a processing unit for performing predetermined processing for a substrate; a control unit for taking in outside air and controlling the outside air taken in at a temperature lower than a preset air temperature in the processing unit and at a predetermined humidity; and a warming unit, provided in or near the processing unit, for warming the air, the temperature and humidity of which are controlled by the control unit, to a predetermined temperature and supplying the air with the predetermined temperature and the predetermined humidity into the processing unit, is provided.

According to the aforesaid structure, the control unit controls outside air at the temperature lower than the preset air temperature in the processing unit and at the predetermined humidity, and the warming unit provided in or near the processing unit warms the supplied air at the predetermined temperature, and thus the final fine control of temperature can be performed by the warming unit even if the temperature of air slightly changes while the air is supplied from the control unit to the processing unit. Accordingly, air of which the temperature and humidity of are precisely controlled can be supplied to the processing unit. Furthermore, the control unit is required to heat air to a temperature lower than the preset air temperature in the processing unit, whereby the warming heat capacity of the control unit can be reduced.

According to a fifth aspect of the present invention, a substrate processing apparatus, comprising: a processing unit for performing predetermined processing for a substrate; a control unit for taking in outside air, temporarily cooling the outside air taken in, and thereafter controlling the outside air to a predetermined humidity; an air supply line, structured to allow air flowing through therein and outside air to perform heat exchange, for supplying the air of which the humidity is controlled by the control unit to the processing unit; and a warming unit, connected to the air supply line and provided in or near the processing unit, for warming the air of which the humidity is controlled by the control unit to a predetermined temperature and supplying it into the processing unit, the air supply line increasing the temperature of air to be supplied from the control unit to the warming unit by performing heat exchange between the air and outside air, is provided.

According to the aforesaid structure, after outside air taken in is cooled temporarily and controlled at the predetermined humidity by the control unit, the heat of outside air is supplied to the flowing air while the air is flowing through the air supply line structured to allow the air and the outside air to perform heat exchange, and thereby the temperature of air with a low temperature, which is cooled temporarily and controlled at the predetermined humidity, can be increased. As a result, energy required for warming air to the predetermined temperature can be reduced, and conventional warming equipment used up to this time in the control unit can be omitted, which leads to simplification of equipment and a reduction in running cost for electric power consumption and the like. The final fine control of temperature is performed by warming air, which is warmed up roughly by the air supply line, by the warming unit provided near the processing unit, whereby air of which the temperature and humidity are precisely controlled can be supplied to the processing unit.

According to a sixth aspect of the present invention, a substrate processing apparatus, comprising: a processing unit for performing predetermined processing for a substrate; a control unit for taking in outside air, temporarily cooling the outside air taken in, and thereafter controlling the outside air to a predetermined humidity; an outside air introducing line for introducing outside air into the control unit; an air supply line for supplying the air controlled by the control unit to the processing unit; and a warming unit, connected to the air supply line and provided in or near the processing unit, for warming the air of which the humidity is controlled by the control unit to a predetermined temperature and supplying it into the processing unit, the outside air introducing line and the air supply line being disposed so that at least parts of them allow heat exchange between them, is provided.

According to the aforesaid structure, the outside air introducing line and the air supply line are disposed so that at least parts of them allow heat exchange between them. Therefore, after outside air taken in is cooled temporarily and controlled at the predetermined humidity by the control unit, heat is supplied from outside air flowing through the outside air introducing line to the air while the air of which the humidity is controlled is flowing through the air supply line, and thereby the temperature of air with a low temperature, which is cooled temporarily and controlled at the predetermined humidity, can be increased, whereas the heat of the outside air flowing through the outside air introducing line is absorbed by the air flowing through the air supply line and the temperature of outside air to be supplied to the control unit can be lowered. As a result, energy required for warming air to the predetermined temperature after humidity control can be reduced, conventional warming equipment used up to this time in the control unit can be omitted, and energy necessary for cooling outside air in the control unit can be reduced, resulting in simplification of equipment and a reduction in running cost for electric power consumption and the like. The final fine control of temperature is performed by warming air, which is warmed up roughly by the air supply line, by the warming unit provided near the processing unit, whereby air of which the temperature and humidity are precisely controlled can be supplied to the processing unit.

These objects and still other objects and advantages of the present invention will become apparent upon reading the following specification when taken in conjunction with the accompanying drawings.

DETAILED DESCRIPTION OF THE PREFERRED EMBODIMENT

A first embodiment of the present invention will be described in detail below with reference to the accompanying drawings.

Figure 1:
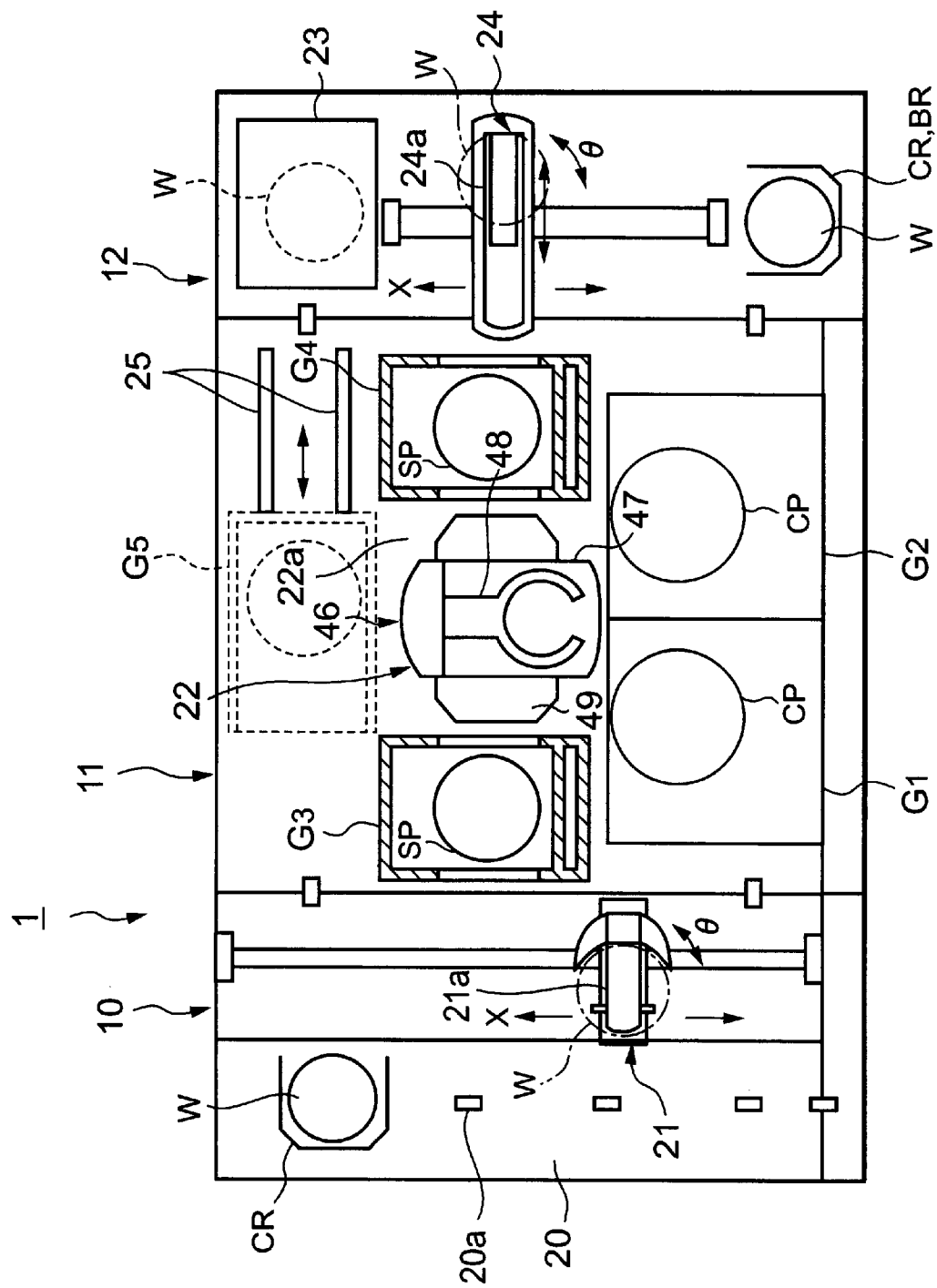
FIG. 1 is a plane view showing the entire structure of a coating and developing processing system for a semiconductor wafer to which the present invention is applied.
Figure 2:
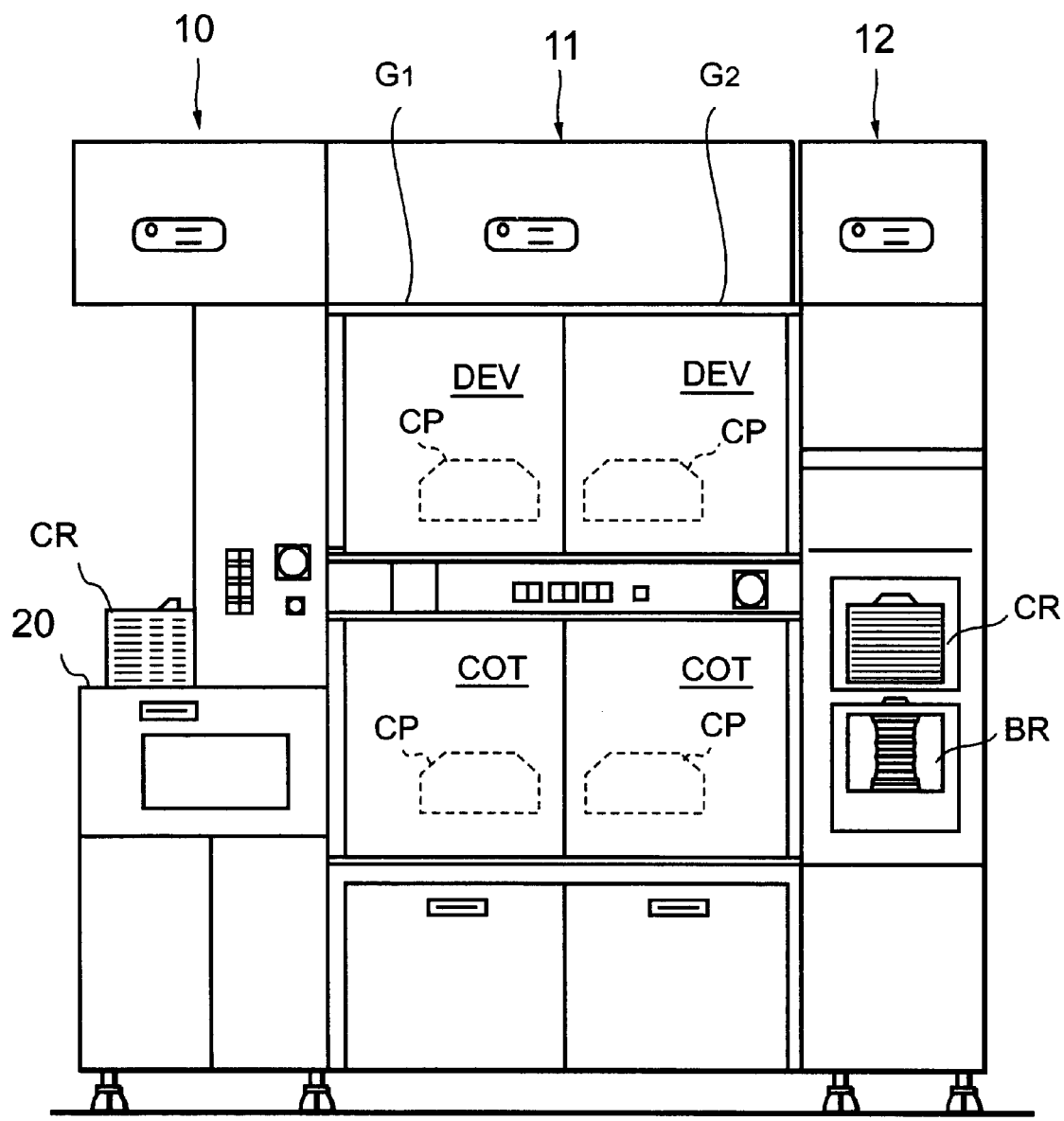
FIG. 2 is a front view showing the entire structure of the coating and developing processing system for the semiconductor wafer to which the present invention is applied.
Figure 3:
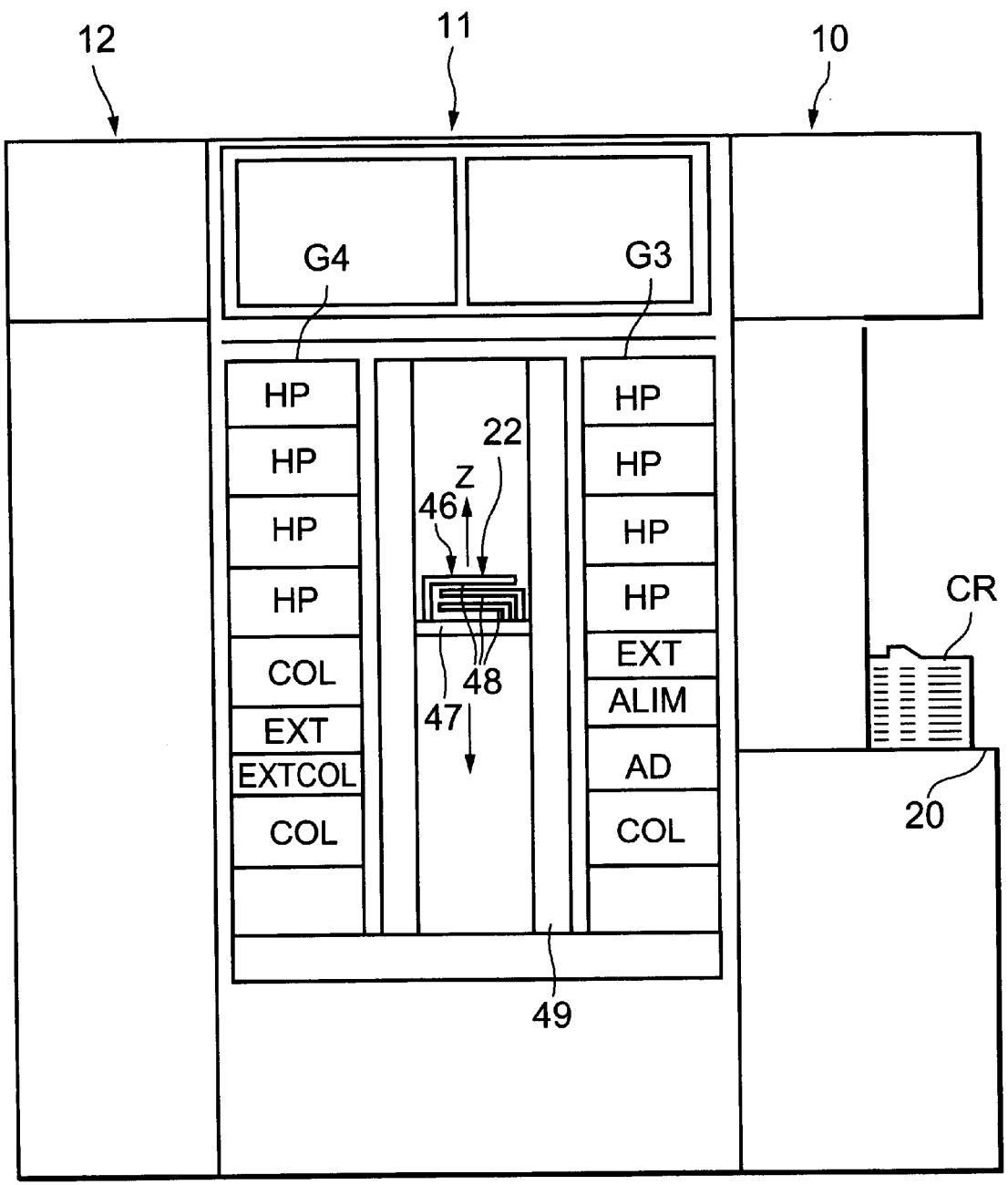
FIG. 3 is a rear view showing the entire structure of the coating and developing processing system for the semiconductor wafer to which the present invention is applied.

FIG. 1 is a schematic plane view showing a resist coating and developing processing system used for carrying out the present invention, FIG. 2 is a front view thereof, and FIG. 3 is a rear view thereof.

The resist coating and developing processing system 1 includes a cassette station 10 being a transfer station, a processing station 11 having a plurality of processing units, and an interface section 12 for receiving and sending a wafer W from/to an aligner (not illustrated) provided adjacent to the processing station 11.

The aforesaid cassette station 10 is to carry a plurality of, for example, 25 semiconductor wafers W (hereinafter referred to as only wafers W) as objects to be processed, as a unit, housed in a wafer cassette CR from another system into this system or from this system into another system, and transfer the wafer W between the wafer cassette CR and the processing station 11.

In this cassette station 10, as shown in FIG. 1, a plurality of (four in FIG. 1) positioning projections 20a are formed on a cassette mounting table 20 along an X-direction in FIG. 1, and the wafer cassettes CR can be mounted in a line with respective wafer transfer ports facing the processing station 11 side at the positions of the projections 20a. In the wafer cassette CR, the wafers W are arranged in a vertical direction (a Z-direction). Moreover, the cassette station 10 has a wafer transfer mechanism 21 situated between the wafer cassette mounting table 20 and the processing station 11. This wafer transfer mechanism 21 has a wafer transfer arm 21a which is movable in the direction of arrangement of cassettes (the X-direction) and the direction of arrangement of the wafers W housed in the cassette (the Z-direction), and can selectively get access to any of the wafer cassettes CR by the transfer arm 21a. The wafer transfer arm 21a is also structured to be rotatable in a θ-direction so as to get access to an alignment unit (ALIM) and an extension unit (EXT) both included in a third processing section $G_3$ on the processing station 11 side which will be described later.

The processing station 11 includes a plurality of processing units for carrying out a series of processes when coating and developing are performed for the wafer W. These units are multi-tiered at predetermined positions, and the wafers W are processed one by one by these units. As shown in FIG. 1, the processing station 11 has a transfer path 22a in the middle thereof, a main wafer transfer mechanism 22 is provided in the transfer path 22a, and all the processing units are arranged around the wafer transfer path 22a. The plurality of processing units are divided into a plurality of processing sections, and a plurality of processing units are multi-tiered along the vertical direction in each of the processing sections.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 can rotate by rotational driving force of a motor (not illustrated), and the wafer transfer device 46 can also rotate integrally with the cylindrical supporter 49.

The wafer transfer device 46 includes a plurality of holding members 48 which are movable in the forward and backward directions of a transfer base 47, and carries out the delivery of the wafer W from/to each of the processing units by using these holding members 48.

As shown in FIG. 1, in this embodiment, four processing sections $G_1$, $G_2$, $G_3$, and $G_4$ are actually arranged around the wafer transfer path 22a, and a processing section $G_5$ can be disposed as required.

Out of these sections, the first and second processing sections $G_1$ and $G_2$ are arranged in a row on the front side of the system (on the lower side in FIG. 1), the third processing section $G_3$ is arranged adjacent to the cassette station 10, and the fourth processing section $G_4$ is arranged adjacent to the interface section 12. Moreover, the fifth processing section $G_5$ can be arranged on the rear side.

In the above case, as shown in FIG. 2, in the first processing section $G_1$, two spinner-type processing units each for performing predetermined processing for the wafer W while the wafer W is mounted on a spin chuck (not illustrated) inside a cup CP are vertically two-tiered. In this embodiment, a resist coating processing unit (COT) for coating the wafer W with a resist and a developing processing unit (DEV) for developing a pattern of the resist are two-tiered from the bottom in order. Similarly, in the second processing section $G_2$, a resist coating processing unit (COT) and a developing processing unit (DEV) as two spinner-type processing units are two-tiered from the bottom in order.

The reason why the resist coating processing unit (COT) or the like is disposed on the lower tier side is that drainage of a resist solution is essentially more complex in terms of both mechanism and maintenance than that of a developing solution, and that the complexity is mitigated by disposing the resist coating processing unit (COT) or the like at the lower tier as described above. It is possible, however, to arrange the resist coating processing unit (COT) or the like at the upper tier as required.

As shown in FIG. 3, in the third processing section $G_3$, oven-type processing units each for performing predetermined processing for the wafer W while the wafer W is placed on a mounting table SP are multi-tiered. Namely, a cooling unit (COL) for performing cooling processing, an adhesion unit (AD) for performing so-called hydrophobic processing to enhance adhesion of the resist, an alignment unit (ALIM) for performing alignment, an extension unit (EXT) for carrying the wafer W in and out, and four heat processing units (HP) for performing heat processing for the wafer W before and after exposure processing and after developing processing are eight-tiered from the bottom in order. It is suitable to provide a cooling unit (COL) in place of the alignment unit (ALIM) and to give the cooling unit (COL) an alignment function.

Also in the fourth processing section $G_4$, oven-type processing units are multi-tiered. More specifically, a cooling unit (COL), an extension and cooling unit (EXTCOL) which is a wafer carrying in/out section provided with a chill plate, an extension unit (EXT), a cooling unit (COL), and four heat processing units (HP) are eight-tiered from the bottom in order.

The above arrangement of the cooling unit (COL) and the extension and cooling unit (EXTCOL) having low processing temperature at the lower tiers and the heat processing units (HP) having high processing temperature at the upper tiers can reduce thermal mutual interference between units. Random multi-tiered arrangement is naturally suitable.

As described above, the fifth processing section $G_5$ can be provided on the rear side of the main wafer transfer mechanism 22. In the case where the fifth processing unit group $G_5$ is provided, it can be moved along guide rails 25 laterally when seen from the main wafer transfer mechanism 22. Accordingly, even when the fifth processing section $G_5$ is provided, a spatial portion is secured by sliding the fifth processing section $G_5$ along the guide rails 25, so that maintenance operations for the main wafer transfer mechanism 22 can be easily performed from the back thereof. In this case, a space can be secured not only by moving the fifth processing unit group $G_5$ linearly, but also by turning it. Incidentally, a processing section having a structure in which oven-type processing units are multi-tiered basically likewise with the third and fourth processing sections $G_3$ and $G_4$ can be used as the fifth processing section $G_5$.

The aforesaid interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, a peripheral aligner 23 is disposed at the rear, and a wafer transfer mechanism 24 is disposed at the center. The wafer transfer mechanism 24 has a wafer transfer arm 24a, and the wafer transfer arm 24a moves in the X-direction and the Z-direction to be able to get access to both the cassettes CR and BR, and the peripheral aligner 23. Moreover, the wafer transfer arm 24a is rotatable in the θ-direction and can get access to the extension unit (EXT) included in the fourth processing section $G_4$ in the processing station 11 and to an adjoining wafer delivery table (not illustrated) on the aligner side.

In such a resist coating and developing processing system 1, in the cassette station 10, the wafer transfer arm 21a of the wafer transfer mechanism 21 first gets access to the wafer cassette CR housing unprocessed wafers W on the cassette mounting table 20, takes one wafer W out of the cassette CR, and transfers the wafer W to the extension unit (EXT) of the third processing section $G_3$.

The wafer W is carried into the processing station 11 from the extension unit (EXT) by means of the wafer transfer device 46 of the main wafer transfer mechanism 22. Then, the wafer W is aligned by the alignment unit (ALIM) of the third processing section $G_3$ and thereafter transferred to the adhesion unit (AD), where hydrophobic processing (HMDS processing) for enhancing adhesion of the resist is performed for the wafer W. Since this processing involves heating, the wafer W is then transferred to the cooling unit (COL) by the wafer transfer device 46 and cooled.

The wafer W which has been cooled in the cooling unit (COL) after the completion of the adhesion processing is subsequently transferred to the resist coating processing unit (COT) by the wafer transfer device 46, and a coating film is formed there. After the completion of the coating processing, the wafer W is subjected to pre-bake processing in any one of the heat processing units (HP) of the processing sections $G_3$ and $G_4$, and then cooled in any one of the cooling units (COL).

The cooled wafer W is transferred to the alignment unit (ALIM) of the third processing section $G_3$ and aligned there, and thereafter transferred to the interface section 12 via the extension unit (EXT) of the fourth processing section $G_4$.

In the interface section 12, peripheral exposure is performed for the wafer W to remove the excess resist by the peripheral aligner 23. Thereafter, exposure processing is performed for a resist film on the wafer W in accordance with a predetermined pattern by the aligner (not illustrated) provided adjacent to the interface section 12.

The exposed wafer W is returned again to the interface section 12 and then transferred to the extension unit (EXT) included in the fourth processing section $G_4$ by the wafer transfer mechanism 24. The wafer W is transferred to any one of the heat processing units (HP) by the wafer transfer device 46 to undergo post-exposure bake processing and then cooled in the cooling unit (COL).

The wafer W is then transferred to the developing processing unit (DEV), where the exposed pattern is developed. After the completion of the developing, the wafer W is transferred to any one of the heat processing units (HP) to undergo post-bake processing and then cooled in the cooling unit (COL). After the completion of such a series of processing, the wafer W is returned to the cassette station 10 via the extension unit (EXT) of the third processing section $G_3$ and housed in any of the wafer cassettes CR.

Figure 11:
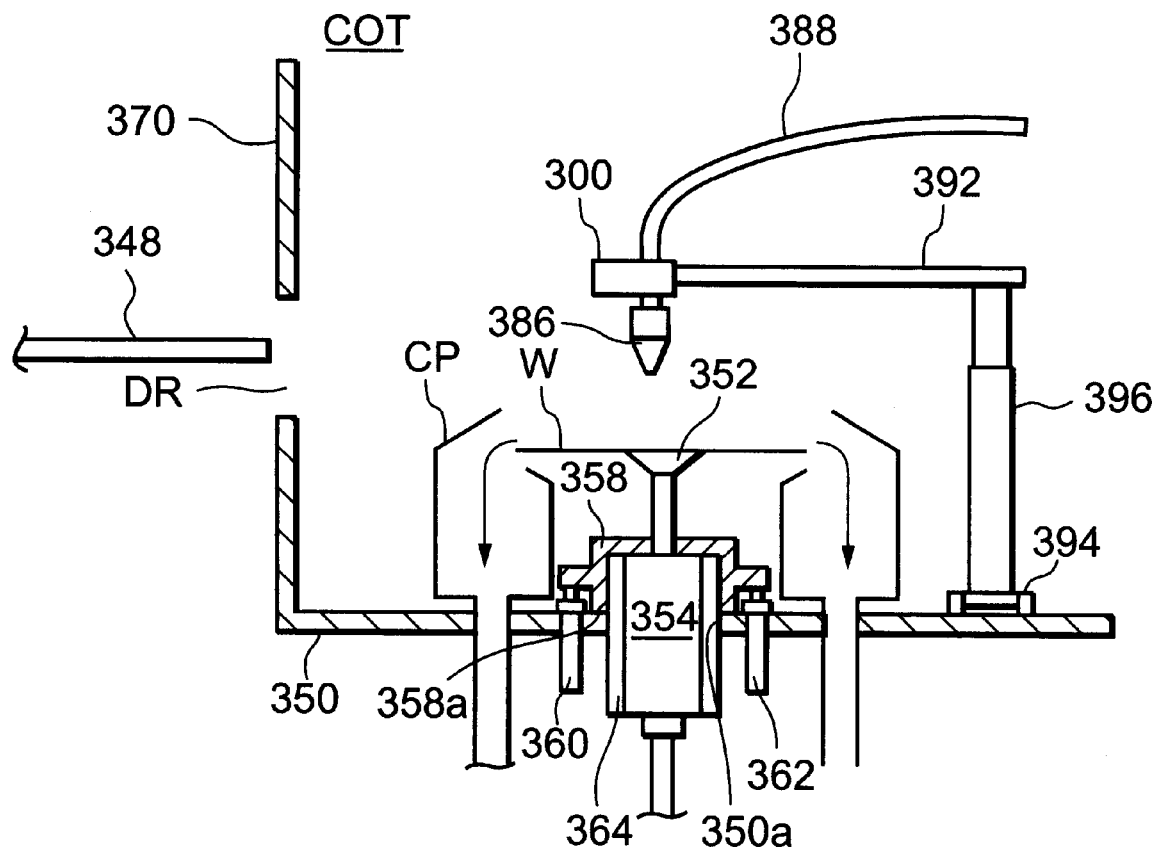
FIG. 11 is a schematic sectional view showing a resist coating processing unit (COT) in the coating and developing processing system for the semiconductor wafer to which the present invention is applied.
Figure 12:
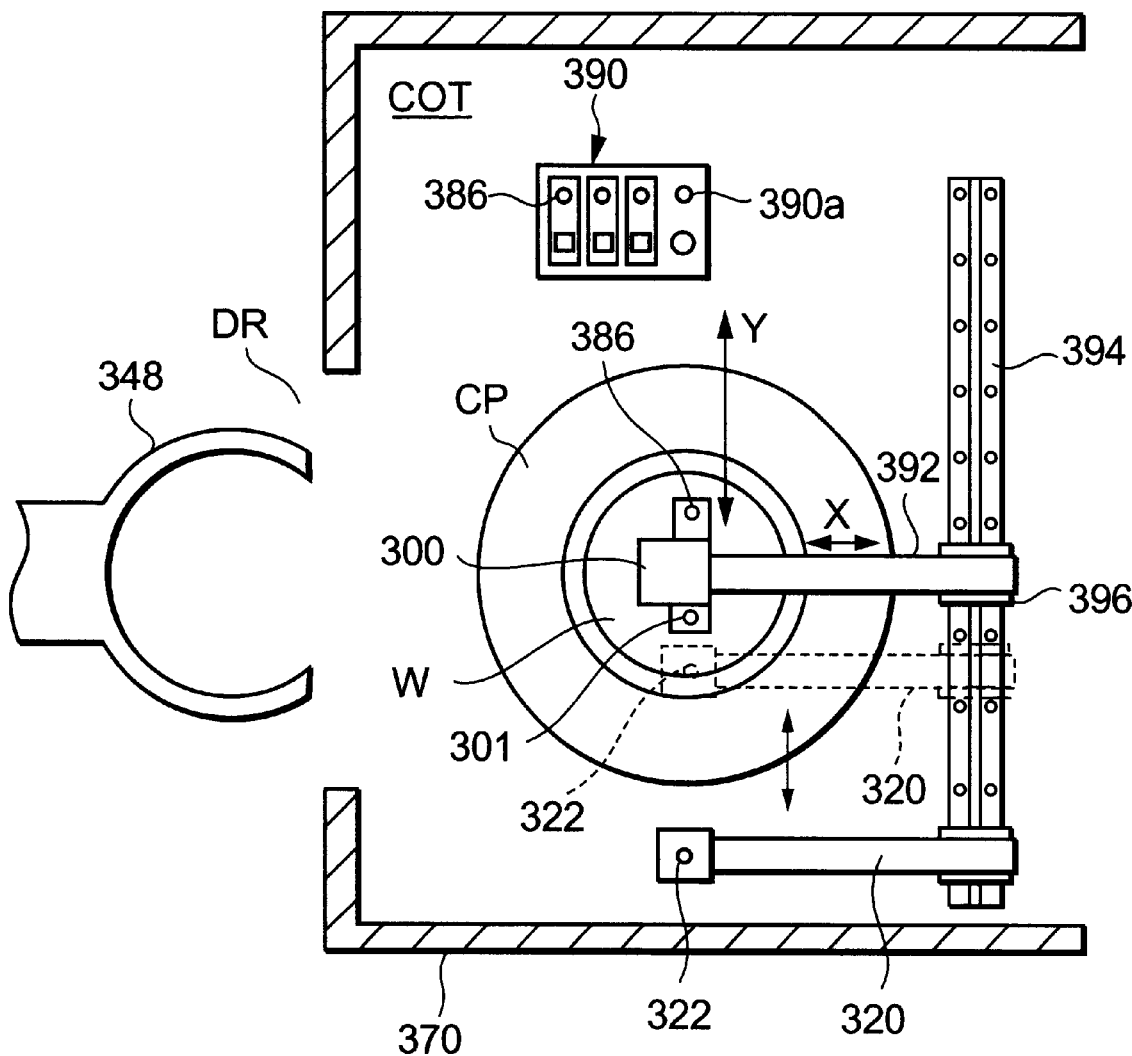
FIG. 12 is a schematic plan view showing the resist coating processing unit (COT) in the coating and developing processing system for the semiconductor wafer to which the present invention is applied.

Next, the resist coating processing unit (COT) will be explained by means of FIG. 11 and FIG. 12. FIG. 11 and FIG. 12 are a schematic sectional view and a schematic plan view respectively showing the entire structure of the resist coating processing unit (COT).

The resist coating processing unit (COT) has a casing 370 and an annular cup CP is disposed in the middle thereof. A spin chuck 352 is disposed inside the cup CP. The spin chuck 352 is rotationally driven by a drive motor 354 while fixedly holding the wafer W by vacuum suction. The drive motor 354 is disposed so as to be ascendable and descendable in an opening 350a provided in a unit base plate 350, and coupled to an ascent/descent driving means 360 and an ascent/descent guiding means 362, for example, composed of air cylinders, with a cap-shaped flange member 358, for example, made of aluminum between them. A cylindrical cooling jacket 364, for example, made of SUS is attached to the side face of the drive motor 354, and the flange member 358 is attached to cover the upper half of the cooling jacket 364.

At the time of resist coating, a lower end 358a of the flange member 358 is closely attached to the unit base plate 350 in the vicinity of the outer periphery of the opening 350a, whereby the inside of the unit is closed tightly. When the wafer W is delivered from/to the spin chuck 352 to/from holding member 348 of a main wafer transfer mechanism 322, the lower end of the flange member 358 is lifted off the unit base plate 350 by the drive motor 354 or the spin chuck 352 being raised by the ascent/descent driving means 360.

A resist nozzle 386 for supplying a resist solution to the front face of the wafer W is connected to a resist solution supply section (not illustrated) with a resist solution supply pipe 388 between them. The resist nozzle 386 is removably attached to the forward end portion of the a resist nozzle scan arm 392 with a nozzle supporter 300 between them. This resist nozzle scan arm 392 is attached to the upper end portion of a vertical support member 396 which is horizontally movable on guide rails 394 laid in one direction (a Y-direction) on the unit base plate 350, and moves in the Y-direction integrally with the vertical support member 396 by a Y-directional drive mechanism not illustrated.

After discharging a resist solution, the resist nozzle 386 sucks buck the resist solution, thereby preventing the resist solution from dripping and moreover from drying.

The resist nozzle scan arm 392 is movable also in the X-direction orthogonal to the Y-direction in order that the resist nozzle 386 is selectively attached thereto at a resist nozzle waiting section 390, and moves in the X-direction by an X-directional drive mechanism not illustrated.

A discharge port of the resist nozzle 386 is inserted into a port 390a of a solvent atmosphere chamber at the resist nozzle waiting section 390 and exposed to an atmosphere of a solvent therein, whereby a resist solution at the tip of the nozzle is not solidified nor deteriorated. Further, a plurality of resist nozzles 386 are provided, and from among theses nozzles, the appropriate one is chosen depending on the type of resist solution.

A solvent nozzle 301 for supplying a solvent, for example, thinner to wet the front face of the wafer onto the front face of the wafer prior to the supply of a resist solution onto the front face of the wafer is attached to the forward end portion (the nozzle supporter 300) of the resist nozzle scan arm 392. The solvent nozzle 301 is connected to a solvent supply section with a solvent supply pipe not illustrated between them. The solvent nozzle 301 and the resist nozzle 386 are attached so that respective discharge ports are situated on a straight line along the Y-direction of movement of the resist nozzle scan arm 392.

A vertical support member movable in the Y-direction for supporting a rinse nozzle scan arm 320 as well as the vertical support member 396 for supporting the resist nozzle scan arm 392 is provided on the guide rails 394. A rinse nozzle 322 for side rinse is attached to the forward end portion of the rinse nozzle scan arm 320. The rinse nozzle scan arm 320 and the rinse nozzle 322 move translationally or rectilinearly between a rinse nozzle waiting position (position shown by a full line) set by the side of the cup CP and a rinse solution discharge position (position shown by a dotted line) set directly above the peripheral portion of wafer W mounted on the spin chuck 352.

Resist solution coating processing operation by a resist-saving method in which less resist solution is consumed than in prior arts in the resist coating processing unit (COT) structured as above will be explained below.

First, when being transferred to a position directly above the cup CP in the resist coating processing unit (COT) by the holding member 348 of the main wafer transfer mechanism 322, the wafer W is vacuum-sucked by the spin chuck 352 which is raised by the ascent/descent driving means 360 and the ascent/descent guiding means 362, for example, composed of air cylinders. Thereafter, the holding member 348 of the main wafer transfer mechanism 322 withdraws from within the resist coating processing unit (COT), and the delivery operation of the wafer W to the resist coating processing unit (COT) is completed.

The spin chuck 352 then descends until the wafer W reaches a fixed position in the cup CP, and the rotational drive of the spin chuck 352 is started by the drive motor 354. Thereafter, the movement of the nozzle supporter 300 from the resist nozzle waiting section 390 is started. This movement of the nozzle supporter 300 is performed along the Y-direction.

When the discharge port of the solvent nozzle 301 reaches a position above the center of the spin chuck 352 (the center of the wafer W), a solvent, for example, thinner is supplied to the front face of the rotating wafer W. The solvent supplied to the front face of the wafer W is spread evenly from the center throughout the whole area of the wafer by centrifugal force. The performance of so-called pre-wet processing in which the entire front face of the wafer W is wetted by a solvent such as thinner prior to the coating of a resist solution as described above allows the resist to spread more easily, and as a result, a uniform resist film can be formed with a smaller amount of resist solution.

Subsequently, the nozzle suppoter 300 is moved in the Y-direction until the discharge port of the resist nozzle 386 reaches a position above the center of the spin chuck 352 (the center of the wafer W), and a resist solution is dripped from the discharge port of the resist nozzle 386 to the center of the front face of the rotating wafer W and spread from the center of the wafer W toward its periphery by centrifugal force, resulting in the formation of a resist film on the wafer W.

After the completion of the dripping of the resist solution, the rotational speed of the wafer W is increased and the remaining resist solution is cleared off and also dried, whereby a resist film with a predetermined thickness is formed.

Thereafter, the nozzle supporter 300 is returned to a home position, and the back face of wafer W undergoes backside rinse by cleaning means not illustrated, and if necessary, the side edge portion of the wafer W undergoes side rinse by cleaning means not illustrated. The rotational speed of the wafer W is then increased, a rinse solution for backside rinse and side rinse is removed, thereafter the rotation of the wafer W is stopped, and a coating processing step is completed.

Figure 4:
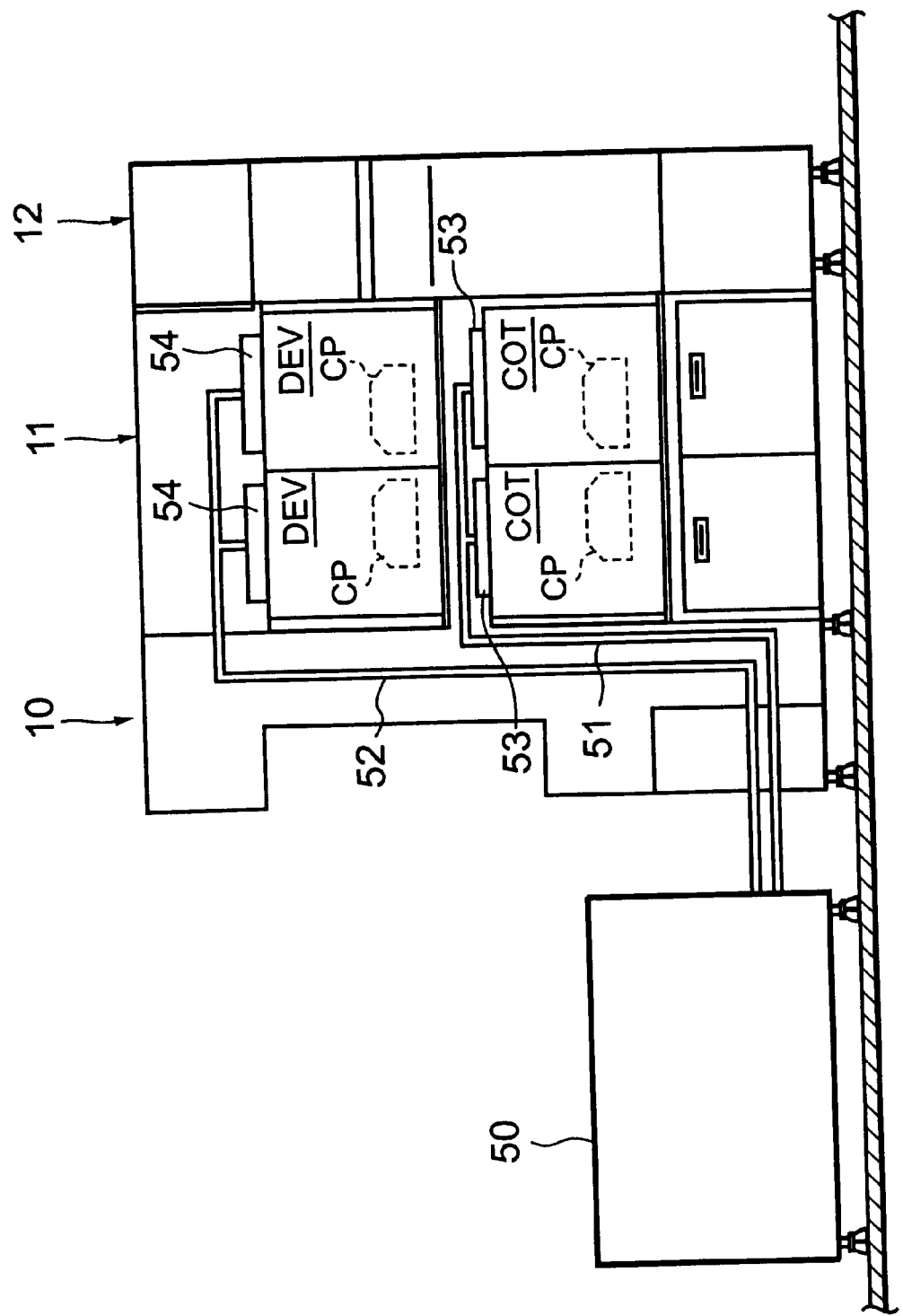
FIG. 4 is a schematic view showing the positional relationship between coating processing units (COT) and developing processing units (DEV) and a temperature and humidity controller for air to be supplied to these units in a first embodiment.

Next, the temperature and humidity control of the coating processing units (COT) and the developing processing units (DEV) in this embodiment will be explained. FIG. 4 is a schematic view showing the positional relationship between the coating processing units (COT) and the developing processing units (DEV), and a temperature and humidity controller.

A temperature and humidity controller 50 is to control the temperature and humidity of air to be supplied to the coating processing units (COT) and the developing processing units (DEV), and is disposed separately from the resist coating and developing processing system 1. As will be described later, air is supplied separately to the coating processing units (COT) and the developing processing units (DEV), and hence a supply line 51 for supplying air from the temperature and humidity controller 50 to the coating processing units (COT) and a supply line 52 for supplying air from the temperature and humidity controller 50 to the developing processing units (DEV) are provided separately.

An air outlet 53 for blowing out air, the temperature and humidity of which are controlled, into the cup (CP) holding the wafer W therein is provided at the top of each of the coating processing units (COT), and an air outlet 54 for blowing out air, the temperature of which is controlled, into the cup (CP) holding the wafer W therein is provided at the top of each of the developing processing units (DEV).

Figure 5:
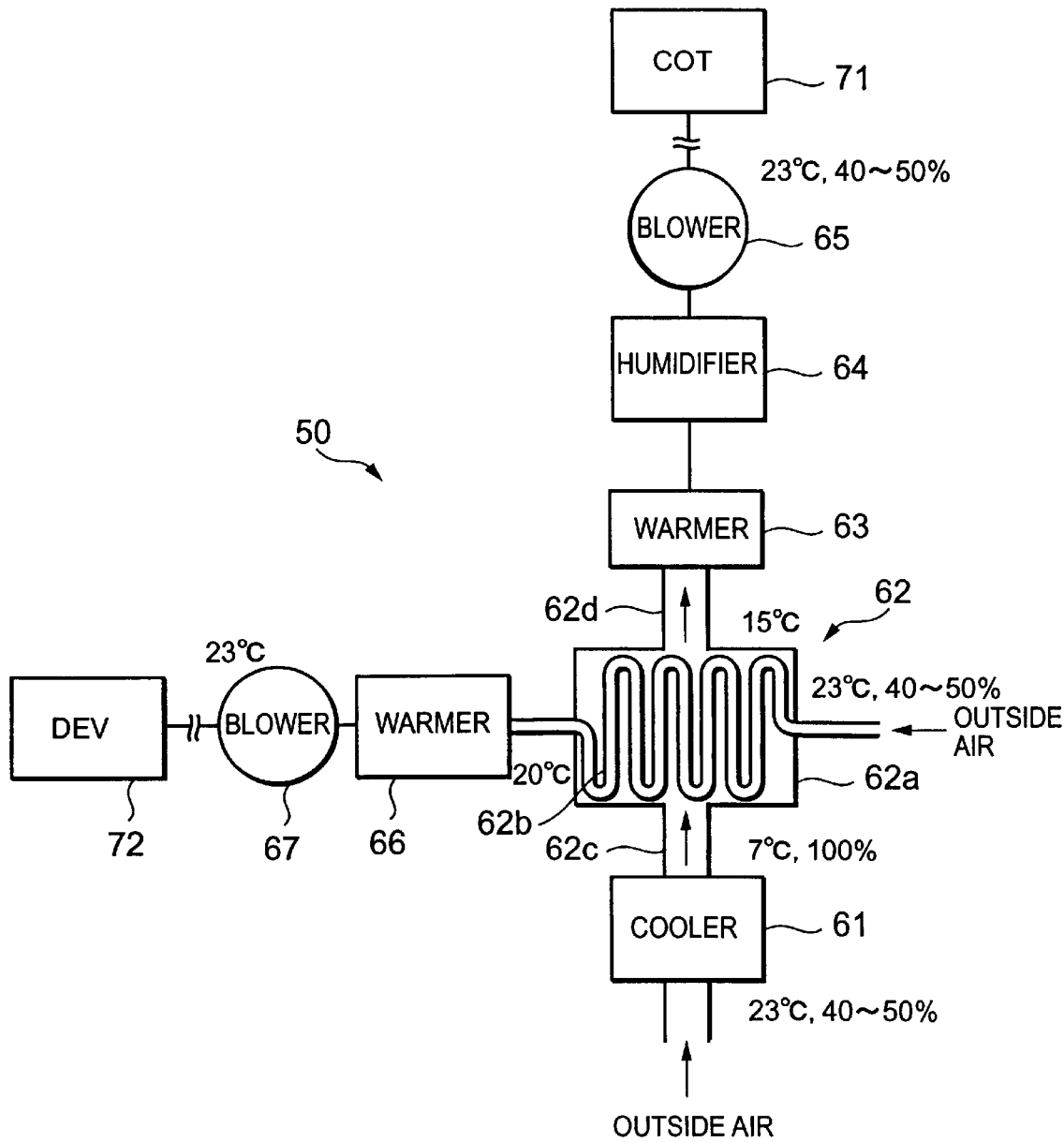
FIG. 5 is a structural view showing the temperature and humidity controller for air to be supplied to the coating processing unit (COT) and the developing processing unit (DEV) in the first embodiment.

FIG. 5 is a diagram showing the structure of the aforesaid temperature and humidity controller 50. The temperature and humidity controller 50 has a shell and tube-type heat exchanger 62, and the heat exchanger 62 has a casing 62a, a tube 62b provided in the casing 62a and bent into a succession of curves, an inlet 62c for letting air flow into the casing 62a, and an outlet 62d for letting air flow out of the casing 62a. A low temperature side flow path in which air which has flowed into the casing 62a from the inlet 62c flows out of the outlet 62d is formed, and the tube 62b functions as a high temperature side flow path.

A cooler 61 is provided on the inlet 62c side of the heat exchanger 62, and on the outlet 62d side, a warmer 63, a humidifier 64, a blower 65, and a coating processing unit (COT) 71 are provided in this order. By means of the blower 65, air cooled in the cooler 61, after passing through the heat exchanger 62, is warmed to a predetermined temperature in the warmer 63 and humidified to a predetermined humidity in the humidifier 64, and reaches the coating processing unit (COT) 71.

Outside air is taken in from one side of the tube 62b of the heat exchanger 62, and a warmer 66, a blower 67, and a developing processing unit (DEV) 72 are connected to the other side thereof in this order. By means of the blower 67, the outside air taken into the heat exchanger 62 from one side of the tube 62b is warmed to a predetermined temperature in the warmer 66, and reaches the developing processing unit (DEV). Incidentally, the aforesaid heat-exchanged air can be also sent to a filter unit (not illustrated) provided at the tops of the units of the processing station 11.

In the temperature and humidity controller 50 structured as above, in the cooler 61, outside air (for example, 23° C., 45%) is taken in and cooled to a temperature (for example, 7° C., 95% to 100%) not more than a dew-point temperature and condensed into dewdrops, whereby moisture contained in the air is removed (dehumidified) and the absolute temperature of the air is lowered.

In the heat exchanger 62, the air with the aforesaid temperature (for example, 7° C., 95% to 100%) not more than the dew-point temperature is taken into the casing 62a through the inlet 62c, whereas outside air (for example, 23° C., 45%) is taken into the tube 62b, and heat exchange is performed between the air and the outside air. In other words, the temperature of the outside air flowing through the tube 62b being the high temperature side flow path falls, while the temperature of the air flowing through the low temperature side flow path rises.

As a result, air to be supplied to the coating processing unit (COT) 71 is warmed up, for example, from 7° C. to 15° C. by absorbing the heat of air to be supplied to the developing unit (DEV) 72, and preheated, whereas air to be supplied to the developing processing unit (DEV) 72 falls in temperature, for example, from 23° C. to 20° C. by its heat being absorbed as described above.

The air with a temperature of 15° C., preheated in the low temperature side flow path of the heat exchanger 62, is warmed up to a predetermined temperature by the warmer 63, and humidified to a predetermined humidity by the humidifier 64, and thus regulated, for example, at a temperature of 23° C. and a humidity between 40% and 50%. The air, the temperature and humidity of which are regulated as described above, is supplied to the coating processing units (COT) through the supply line 51 and the air outlets 53 as shown in FIG. 4.

Meanwhile, the air, the temperature of which is lowered to 20° C. by flowing through the tube 62b of the heat exchanger 62, is warmed up by the warmer 66 and regulated at a predetermined temperature (for example, 23° C.), and then supplied to the developing processing units (DEV) through the supply line 52 and the air outlets 54.

As described above, according to this embodiment, air, which is temporarily cooled by the cooler 61 and then warmed by the heat exchanger 62, and thereafter the temperature and humidity of which are regulated by the warmer 63 and the humidifier 64, is supplied to the coating processing unit (COT) which requires humidity regulation of air as well as temperature regulation thereof. Meanwhile, without being temporarily cooled by the cooler 61, air, the temperature of which is slightly lowered by the heat exchanger 62 and thereafter regulated by the warmer 66, is supplied to the developing processing unit (DEV) which needs only temperature regulation of air and does not need humidity regulation.

Therefore, the cooler 61 cools only air to be supplied to the coating processing unit (COT) and does not cool air to be supplied to the developing processing unit (DEV), whereby the amount of air to be cooled can be made smaller than in the prior arts, and hence the cooler 61 can be downsized and electric power consumption and the like can be reduced.

Since the air supplied to the coating processing unit (COT) is warmed up by absorbing the heat of air supplied to the developing processing unit (DEV) in the heat exchanger 62 and preheated, the warming capacity of the warmer 63 can be decreased, whereby the warmer 63 can be downsized and electric power consumption and the like can be reduced.

Furthermore, the warmer 66 on the developing processing unit (DEV) side is required only to slightly warm up outside air which is lowered a little in temperature and pre-cooled by the heat exchanger 62, and thus the warmer 66 does not need large capacity either, resulting in downsizing and a reduction in electric power consumption.

From these respects, mechanisms for cooling, warming, and humidification can be decreased in capacity and in size as a whole, and running costs for electric power consumption and the like can be reduced. For example, when the numbers of the coating processing units (COT) and the developing processing units (DEV) are the same as shown in FIG. 4, the capacities of the mechanisms for cooling, heating, and humidification can be halved compared with those in the prior arts, thereby making it possible to remarkably reducing running costs for electric power consumption and the like.

Figure 6:
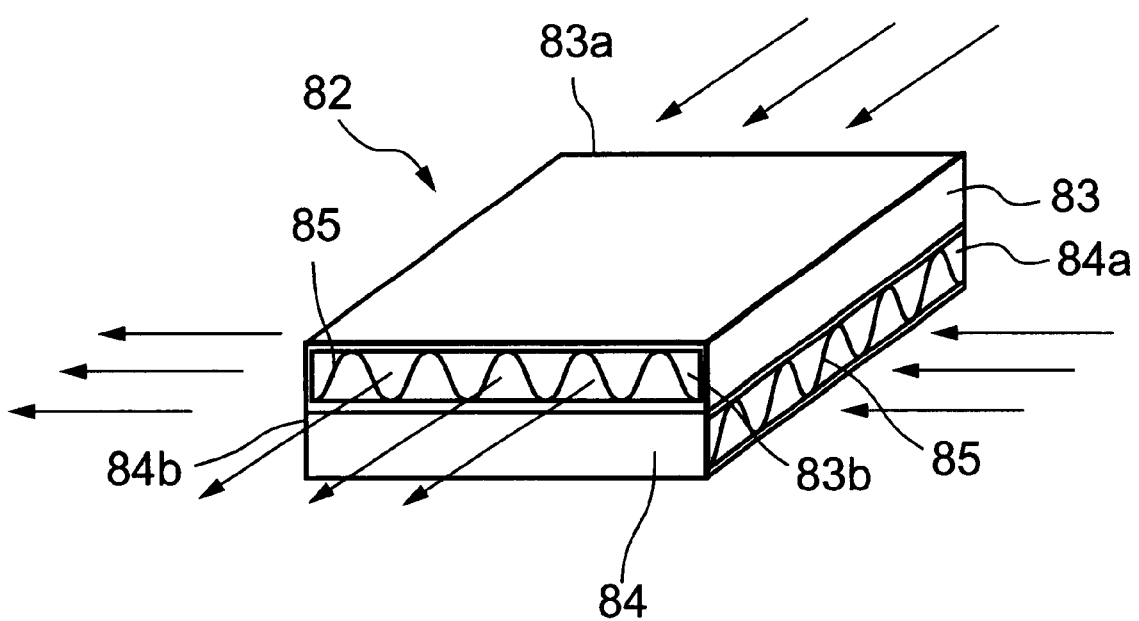
FIG. 6 is a perspective view showing another example of a heat exchanger used for a temperature and humidity controller for air to be supplied to the coating processing unit (COT) and the developing processing unit (DEV) in a second embodiment.

Although the above shows an example in which the shell and tube-type heat exchanger 62 is used in the temperature and humidity controller 50, a cross flow-type heat exchanger 82 such as shown in FIG. 6 can be used as a second embodiment. This cross flow-type heat exchanger 82 is composed by laying a first gas flowing section 83 for letting gas flow in one direction on top of a second gas flowing section 84 for letting gas flow in a direction orthogonal to the one direction. Fins 85 are provided inside these gas flowing sections 83 and 84, whereby heat exchange is effectively performed. A gas introducing portion 83a and a gas exhausting portion 83b are formed in the first gas flowing section 83, and a gas introducing portion 84a and a gas exhausting portion 84b are formed in the second gas flowing section 84.

By introducing air from the cooler 61 from the gas introducing portion 83*a* and introducing outside air from the gas introducing portion 84*a*, heat exchange can be performed between the air and the outside air, and the same piping structure as in FIG. 5 can be realized.

Figure 7:
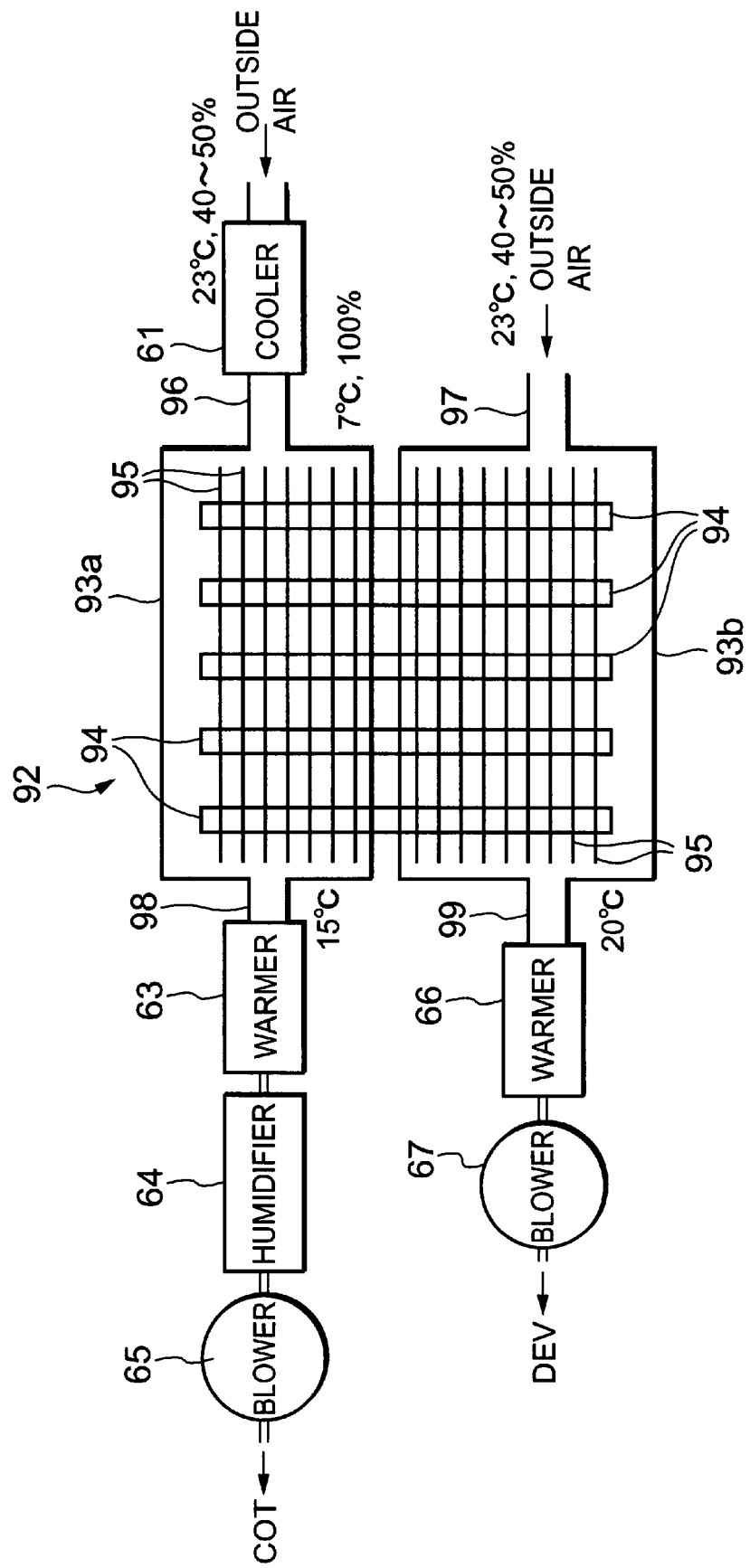
FIG. 7 is a structural view showing another example of a temperature and humidity controller for air to be supplied to the coating processing unit (COT) and the developing processing unit (DEV) in a third embodiment.

Furthermore, a heat pipe-type heat exchanger 92 such as shown in FIG. 7 can be used as a third embodiment. This heat exchanger 92 has two separate casings 93*a* and 93*b*. The casing 93*a* is provided with an introduction port 96 for introducing air from the cooler 61, and the casing 93*b* is provided with an introduction port 97 for introducing outside air. In the casings 93*a* and 93*b*, a plurality of fins are provided in a direction parallel to the introduction direction of the air from the cooler 61 and the outside air, and a plurality of heat pipes 94 are provided to perpendicularly intersect these fins 95. An exhaust port 98 is provided at a position opposite to the introduction port 96 of the casing 93*a*, and an exhaust port 99 is provided at a position opposite to the introduction port 97 of the casing 93*b*.

In such a heat exchanger 92, air cooled in the cooler 61 is introduced from the introduction port 96 into the casing 93*a* and led to the exhaust port 98 along the fins 95 by the blower 65, whereas outside air is introduced from the introduction port 97 into the casing 93*b* and led to the exhaust port 99 along the fins 95 by the blower 65. In this case, one ends of the heat pipes 94 touch the air cooled by the cooler 61, and the other ends thereof touch the outside air, whereby heat moves in such direction that this temperature difference is eliminated, and hence heat exchange is performed. Accordingly, air which is warmed up, for example, to 15° C. by heat exchange after being cooled, for example, to 7° C. in the cooler 61 is exhausted from the exhaust port 98, and after warmed up in the warmer 63, this air is humidified in the humidifier 64, and consequently air with a temperature of 23° C. and a humidity between 40% and 50%, for example, is led to the resist coating unit (COT). Moreover, air obtained by outside air, for example, with a temperature of 23° C. being cooled, for example, to 20° C. by heat exchange is exhausted from the exhaust port 99, and this air is warmed up in the warmer 66, and thus air with a temperature of 23° C. is led to the developing processing unit (DEV).

Figure 8:
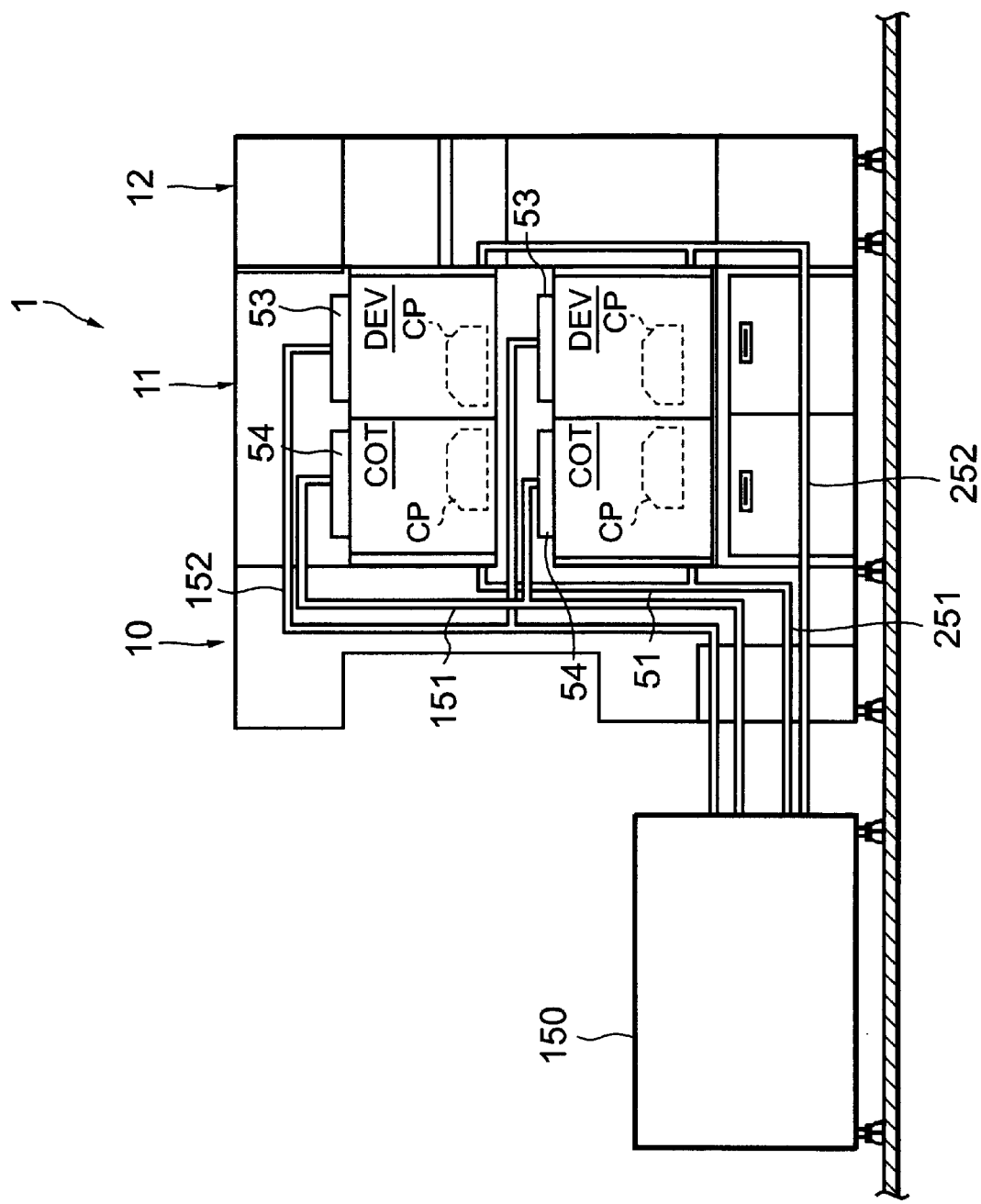
FIG. 8 is a schematic view showing the positional relationship between coating processing units (COT) and developing processing units (DEV) and a temperature and humidity controller for air to be supplied to these units in a fourth embodiment.
Figure 9:
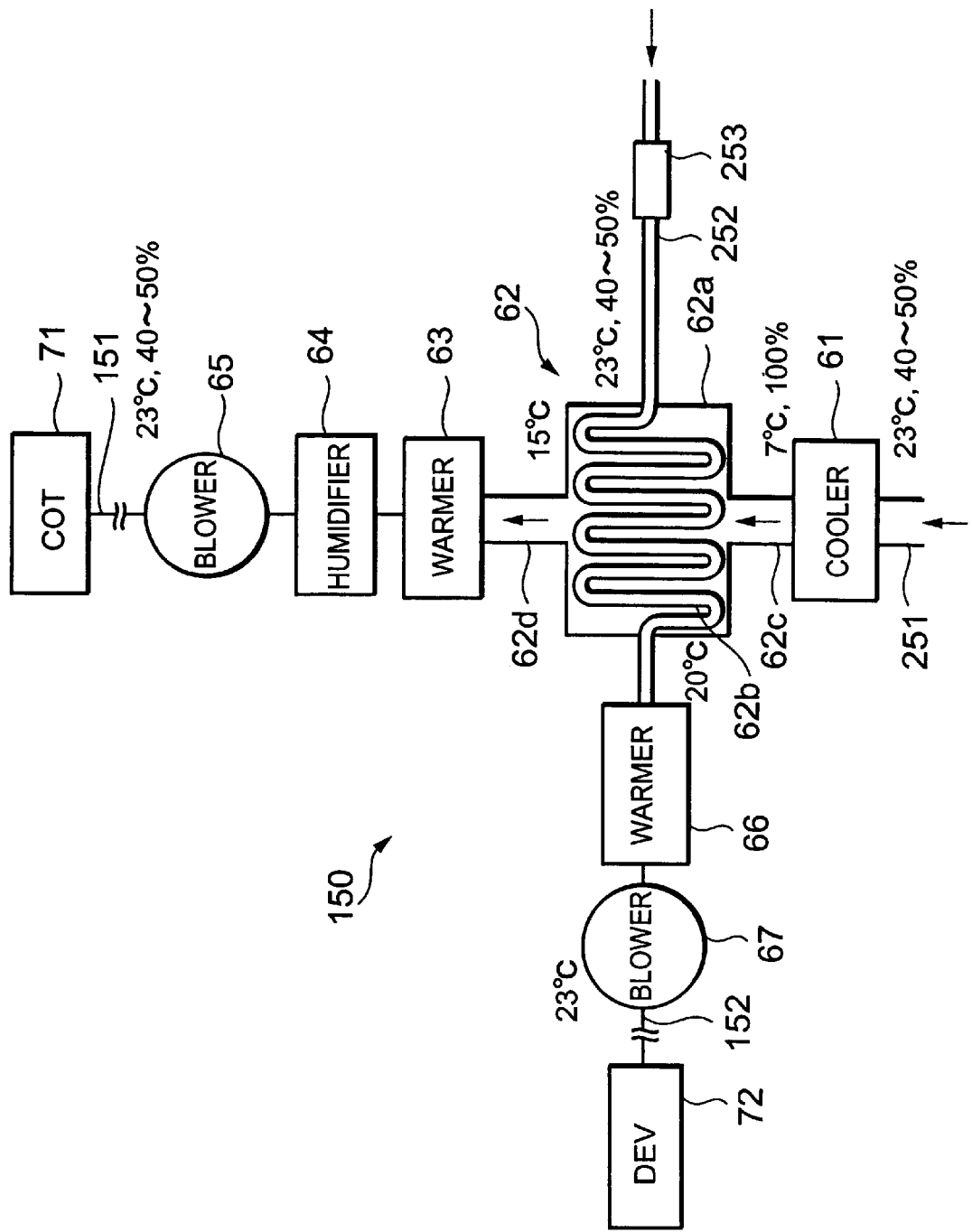
FIG. 9 is a structural view showing the temperature and humidity controller for air to be supplied to the coating processing unit (COT) and the developing processing unit (DEV) in the fourth embodiment.

Next, a fourth embodiment will be explained by means of FIG. 8 and FIG. 9. FIG. 8 is a schematic view showing the positional relationship between coating processing units (COT) and developing processing units (DEV), and a temperature and humidity controller for air to be supplied to these units in the fourth embodiment. FIG. 9 is a structural view showing one example of the temperature and humidity controller for air to be supplied to the coating processing units (COT) and the developing processing units (DEV). Outside air is used in the temperature and humidity controller in the aforesaid first embodiment, whereas air exhausted from the coating processing units (COT) and the developing units (DEV) is reused in this embodiment.

Next, the temperature and humidity control of the coating processing units (COT) and the developing processing units (DEV) in the fourth embodiment will be explained.

A temperature and humidity controller 150 is to control the temperature and humidity of air to be supplied to the coating processing units (COT) and the developing processing units (DEV), and is disposed separately from the resist coating and developing processing system 1. As will be described later, air is supplied separately to the coating processing units (COT) and the developing processing units (DEV), and hence a supply line 151 for supplying air from the temperature and humidity controller 150 to the coating processing units (COT) and a supply line 152 for supplying air from the temperature and humidity controller 150 to the developing processing units (DEV) are provided separately. Moreover, a supply line 251 for supplying air exhausted from within the coating processing units (COT) to the temperature and humidity controller 150 and a supply line 252 for supplying air exhausted from within the developing processing units (DEV) to the temperature and humidity controller 150 are provided.

The air outlet 53 for blowing out air, the temperature and humidity of which are controlled, into the cup (CP) holding the wafer W therein is provided at the top of each of the coating processing units (COT), and the air outlet 54 for blowing out air, the temperature of which is controlled, into the cup (CP) holding the wafer W therein is provided at the top of each of the developing processing units (DEV).

The temperature and humidity controller 150 has the shell and tube-type heat exchanger 62, and the heat exchanger 62 has the casing 62*a*, the tube 62*b* provided in the casing 62*a* and bent into a succession of curves, the inlet 62*c* for letting air flow into the casing 62*a*, and the outlet 62*d* for letting air flow out of the casing 62*a*. A low temperature side flow path in which air which has flowed into the casing 62*a* from the inlet 62*c* flows out of the outlet 62*d* is formed, and the tube 62*b* functions as a high temperature side flow path.

The cooler 61 is provided on the inlet 62*c* side of the heat exchanger 62, and on the outlet 62*d* side, the warmer 63, the humidifier 64, the blower 65, and the coating processing unit (COT) 71 are provided in this order. By means of the blower 65, air cooled in the cooler 61, after passing through the heat exchanger 62, is warmed to a predetermined temperature in the warmer 63, humidified to a predetermined humidity in the humidifier 64, and reaches the coating processing unit (COT) 71.

Air exhausted from the developing processing unit (DEV) is taken in from one side of the tube 62*b* of the heat exchanger 62, and the warmer 66, the blower 67, and the developing processing unit (DEV) 72 are connected to the other side thereof in this order. An ammonia component in air exhausted from the developing processing unit (DEV) to be taken into the tube 62*b* is removed by air passing through a filter 253 provided midway in the supply line 252. By means of the blower 67, the outside air taken into the heat exchanger 62 from one side of the tube 62*b* is warmed to a predetermined temperature in the warmer 66, and reaches the developing processing unit (DEV). Incidentally, the aforesaid heat-exchanged air can be also sent to a filter unit (not illustrated) provided at the tops of the units of the processing station 11.

In the temperature and humidity controller 150 structured as above, in the cooler 61, outside air (for example, 23° C., 45%) is taken in and cooled to a temperature not more than the dew-point temperature (for example, 7° C., 95% to 100%) and condensed into dewdrops, whereby moisture contained in the air is removed (dehumidified), and the absolute temperature of the air is lowered.

In the heat exchanger 62, air, the temperature of which is not more than the aforesaid dew-point temperature (for example, 7° C., 95% to 100%), is taken into the casing 62*a* through the inlet 62*c*, whereas air exhausted from the developing processing unit (DEV) is taken into the tube 62*b*, and heat exchange is performed between these two kinds of air. In other words, the temperature of the exhausted air flowing through the tube 62*b* being the high temperature side flow path falls, while the temperature of the air flowing through the low temperature side flow path rises.

As a result, air to be supplied to the coating processing unit (COT) is warmed up, for example, from 7° C. to 15° C. by absorbing the heat of air supplied to the developing unit (DEV) and preheated, whereas air to be supplied to the developing processing unit (DEV) 72 falls in temperature, for example, from 23° C. to 20° C. by its heat being absorbed as described above.

The air with a temperature of 15° C., preheated in the low temperature side flow path of the heat exchanger 62, is warmed up to a predetermined temperature by the warmer 63, humidified to a predetermined humidity by the humidifier 64, and thus regulated, for example, at a temperature of 23° C. and a humidity between 40% and 50%. The air, the temperature and humidity of which are regulated as described above, is supplied to the coating processing units (COT) through the supply line 151 and the air outlets 53.

Meanwhile, the air, the temperature of which is lowered to 20° C. by flowing through the tube 62b of the heat exchanger 62, is warmed up by the warmer 66 and regulated at a predetermined temperature (for example, 23° C.), and then supplied to the developing processing units (DEV) through the supply line 152 and the air outlets 54.

As described above, according to this embodiment, air exhausted respectively from the coating processing units (COT) and the developing processing units (DEV) is reused and supplied again to the same units, whereby energy necessary for regulating air at desired temperature and humidity can be held down, and electric power consumption can be further reduced. Furthermore, since processing units of the same kind are tiered vertically, and down flow structure is adopted in this embodiment, air exhausted from within the coating processing units (COT) and the developing processing units (DEV) can be collected efficiently.

Figure 10:
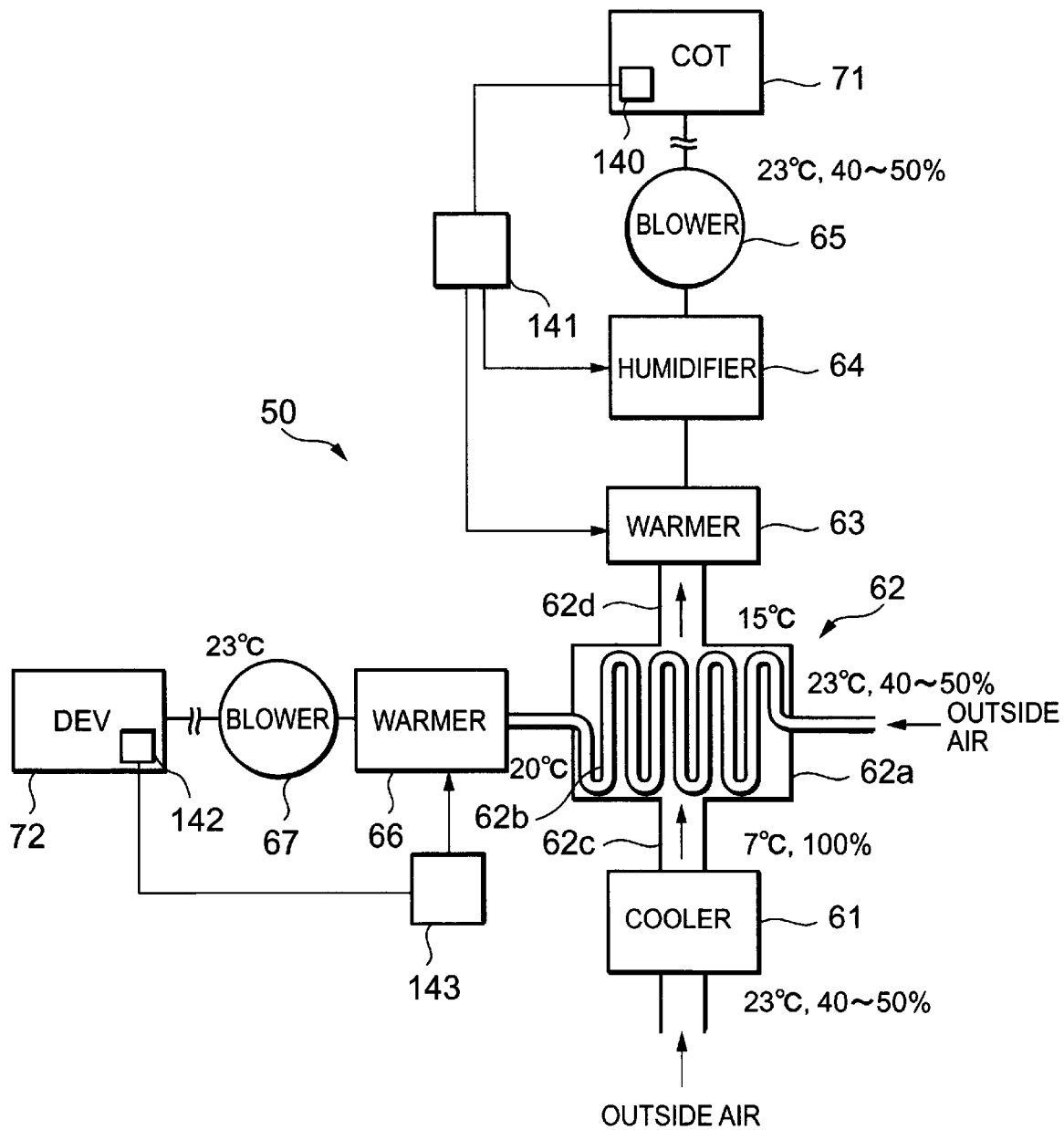
FIG. 10 is a structural view showing a temperature and humidity controller for air to be supplied to the coating processing unit (COT) and the developing processing unit (DEV) in a fifth embodiment.

Next, a fifth embodiment will be explained by means of FIG. 10. FIG. 10 is a structural view showing one example of a temperature and humidity controller for air to be supplied to the coating processing unit (COT) and the developing processing unit (DEV). In this embodiment, in addition to the structure of the first embodiment, a temperature and humidity measuring section 140 disposed in the coating and processing unit (COT) and a temperature and humidity controlling section 141 connected to the temperature and humidity measuring section 140 are provided. The optimum temperature and humidity for processing in the coating processing unit (COT) are previously inputted as comparison values to the temperature and humidity controlling section 141. Measured values measured in the temperature and humidity measuring section 140 are inputted to the temperature and humidity controlling section 141. The measured values and the comparison values previously inputted are compared, and correction values are computed. The humidifier 64 and the warmer 63 are controlled based on the computed correction data. Similarly, a temperature measuring section 142 and a temperature controlling section 143 can be provided also in the developing processing unit (DEV).

The aforesaid provision of the controlling section enables coating processing or developing processing under more appropriate conditions.

Although as examples of a heat exchanger, the shell and tube-type, cross flow-type, and heat pipe-type heat exchangers are shown on illustration, heat exchangers of other types are also possible. Besides, the coating and developing processing system for semiconductor wafers is explained in the aforesaid embodiments, but the present invention can be applied to a coating and developing processing system for substrates to be processed other than the semiconductor wafers, for example, LCD substrates, and various modifications are possible. Namely, the present invention can be applied to a system which has units requiring both temperature and humidity control and units requiring only temperature control. For example, as an example of the unit requiring only temperature control, a transfer route for the wafer W is given.

Next, a sixth embodiment will be explained by means of FIG. 13. This embodiment differs from the aforesaid embodiments in part of a temperature and humidity controlling mechanism for air to be supplied to the resist coating processing unit (COT).

Figure 13:
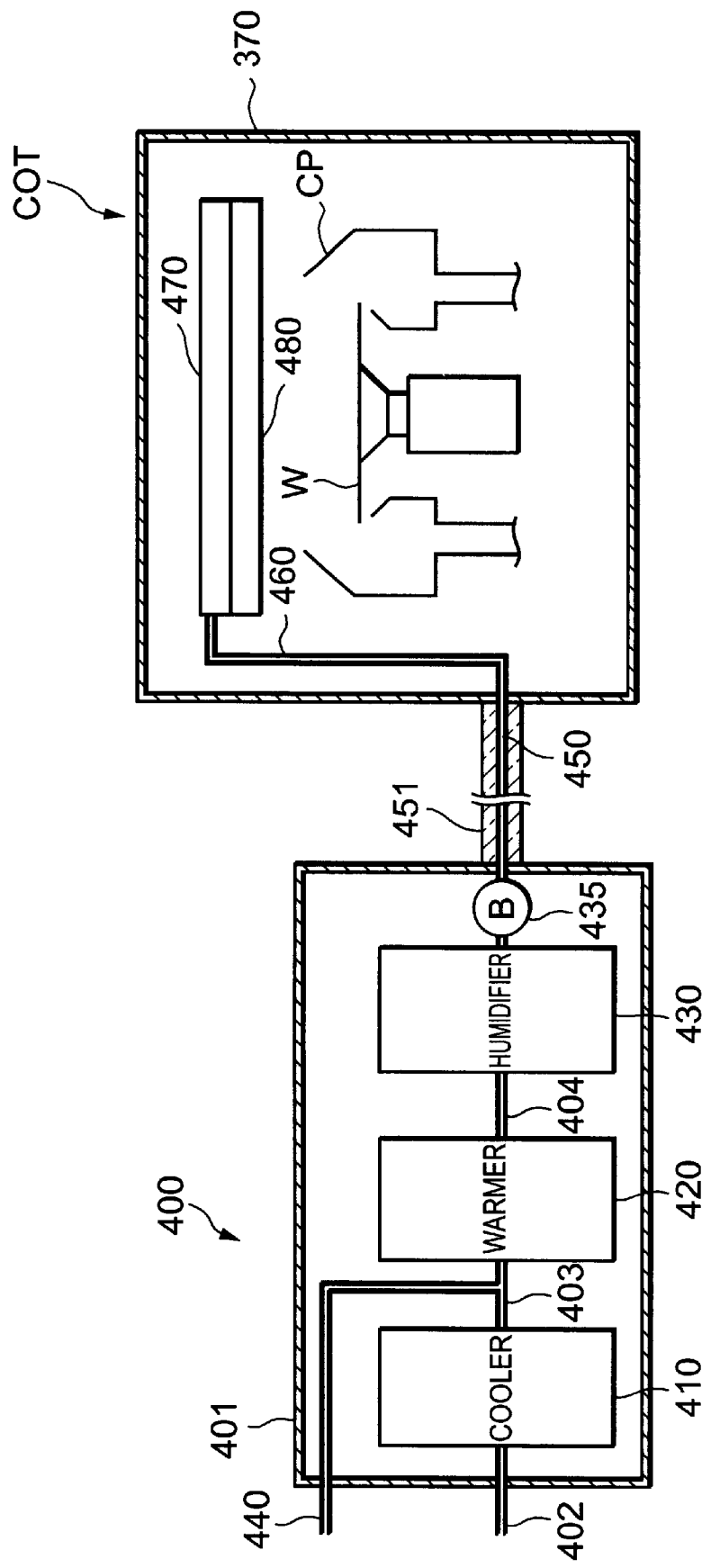
FIG. 13 is a sectional view showing a temperature and humidity controlling mechanism used in a sixth embodiment.

In the sixth embodiment, as shown in FIG. 13, a control unit 400 for controlling the temperature and humidity of air to be supplied to the coating processing unit (COT) is disposed apart from the resist coating and developing processing system 1. The control unit 400 has a casing 401, and provided in this casing 401 are a cooler 410 for cooling outside air taken in (for example, 23° C., 40% to 50%) to a temperature (for example, 7° C.) not more than the dew-point temperature, a warmer 420 for warming the cooled air to a temperature (for example, 22° C.) slightly lower than the temperature of air (for example, 23° C.) in the coating processing unit (COT) which is previously set, a humidifier 430 for humidifying the warmed air to a predetermined humidity (for example, 40% to 50%), and a blower 435 for blowing out the air into the coating processing unit (COT). An intake pipe 402 for taking air into the cooler 410 is connected to the cooler 410, the cooler 410 and the warmer 420 are connected with a pipeline 403, and the warmer 420 and the humidifier 430 are connected with a pipeline 404. A bypass line 440 for taking in outside air (for example, 23° C.) and mixing it with the cooled air is connected to the pipeline 403 connecting the cooler 410 and the warmer 420.

An air supply line 450 for supplying air to the coating processing unit (COT) is provided from the control unit 400 to the coating processing unit (COT). The air supply line 450 is coated with a heat insulating material 451.

In the coating processing unit (COT), a heater is incorporated, and a warming unit 470 for warming air, for example, with a temperature of 22° C. and a humidity between 40% and 50%, supplied through the air supply line 450 to a preset temperature and a filter unit 480 having a ULPA filter for trapping particles in the air from the warming unit 470 are provided. Incidentally, a pipeline 460 for connecting the air supply line 450 and the warming unit 470 is disposed in the casing 370.

When the temperature and humidity of air to be supplied to the coating processing unit (COT) are controlled by the temperature and humidity controlling mechanism structured as above, outside air (for example, 23° C., 40% to 50%) outside the resist coating and developing processing system is first taken into the cooler 410 through the intake pipe 402 and cooled to a temperature (for example, 7° C.) not more than the dew-point temperature. On this occasion, the relative humidity is almost 100%, and supersaturated moisture is condensed into dewdrops and removed, whereby the absolute amount of moisture contained in the air is reduced.

Subsequently, outside air taken in through the bypass line 440 is mixed with the air cooled to the temperature not more than the dew-point temperature as above, and thus the temperature of air is regulated, for example, at 15° C. This air is introduced into the warmer 420 and warmed to a temperature (for example, 22° C.) slightly lower than the preset air temperature in the coating processing unit (COT).

Further, the air is introduced into the humidifier 430 and humidified to a predetermined humidity (for example, 40% to 50%).

The air regulated at the temperature slightly lower than the preset temperature and the predetermined humidity as above is supplied to the warming unit 470 through the air supply line 450 and the pipeline 460 by a blower 435. On this occasion, the air supply line 450 is coated with the heat insulating material 460, thereby preventing the temperature of air from changing in the middle of air supply.

This air is regulated at a preset air temperature in the coating processing unit (COT) by being warmed by the warming unit 470, and blown out into the coating processing unit (COT) through the ULPA filter of the filter unit 480.

Since the final fine control of temperature is performed by the warming unit 470 in the coating processing unit (COT) even if the temperature of air slightly changes while the air is supplied from the control unit 400 to the coating processing unit (COT), air, the temperature and humidity of which are precisely controlled, can be supplied to the coating processing unit (COT). Furthermore, since warming to a final temperature is unnecessary in the control unit 400, the warming heat capacity of the warming unit 420 in the control unit 400 can be reduced to some extent.

Figure 14:
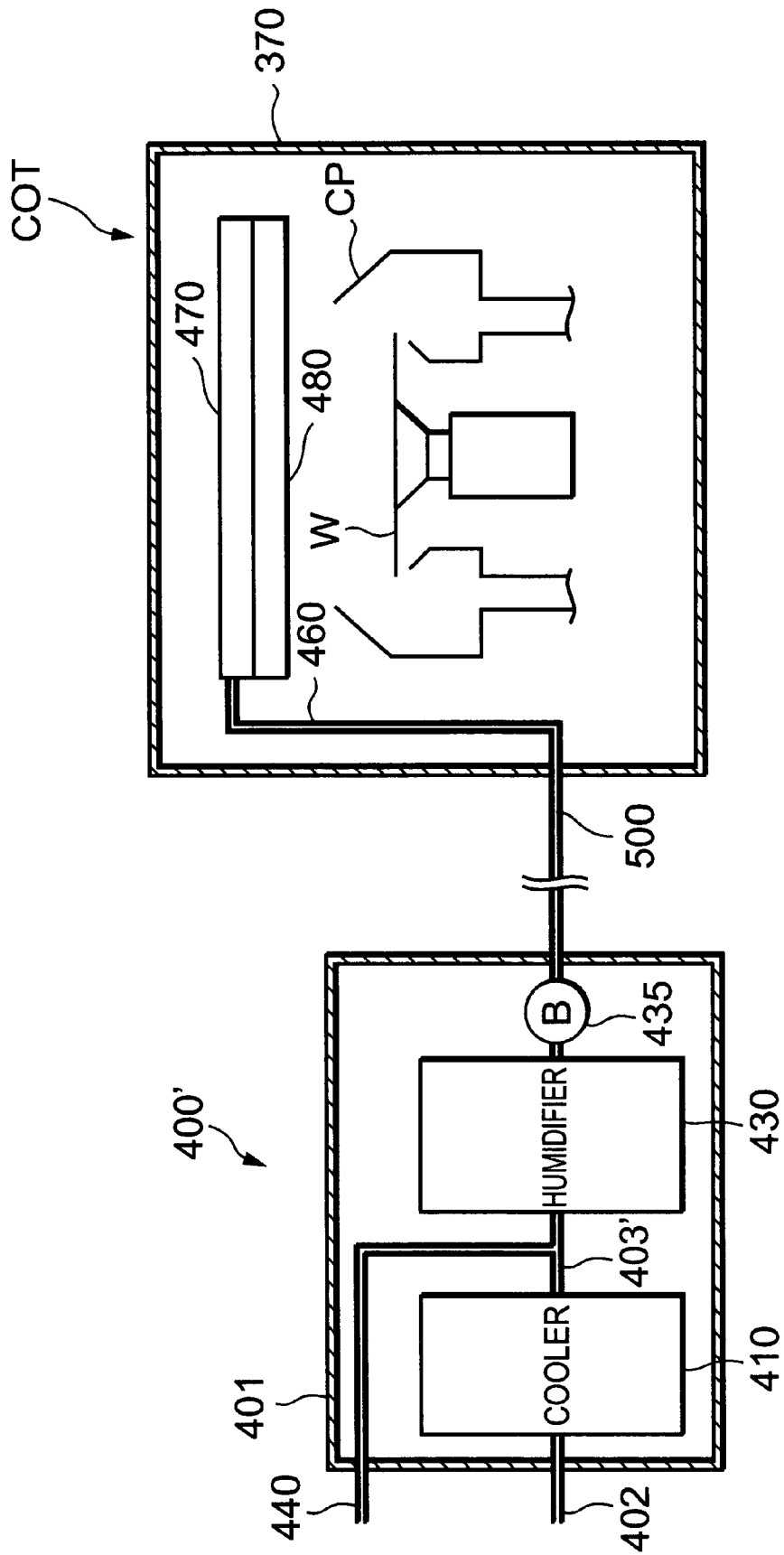
FIG. 14 is a sectional view showing a temperature and humidity controlling mechanism used in a seventh embodiment.

Next, another temperature and humidity controlling mechanism for air to be sent to the coating processing unit (COT) will be explained as a seventh embodiment with reference to FIG. 14. In this embodiment, the temperature of air can be increased by performing heat exchange when air is supplied form the control unit 400 to the resist coating processing unit (COT), and thus a warmer in the control unit is omitted.

More specifically, a control unit 400' includes the cooler 410, the humidifier 430, and the blower 435, and a warmer is omitted. Between the control unit 400' and the coating processing unit (COT), an air supply line 500 which is not coated with a heat insulating material and allows heat exchange with outside air is provided. Therefore, air flowing through the air supply line 500 absorbs the heat of outside air, and hence the air supply line 500 functions as a warmer. Thereby, a warmer in the control unit 400' can be omitted. In the control unit 400', the cooler 410 and the humidifier 430 are connected with a pipeline 403', and the bypass line 440 for taking in outside air (for example, 23° C.) and mixing it with the cooled air is connected to the pipeline 403'.

When the temperature and humidity of air to be supplied to the coating processing unit (COT) are controlled by the temperature and humidity controlling mechanism structured as above, outside air (for example, 23° C., 40% to 50%) outside the resist coating and developing processing system is first taken into the cooler 410 through the intake pipe 402 and cooled to a temperature (for example, 7° C.) not more than the dew-point temperature. On this occasion, the relative humidity is almost 100%, and supersaturated moisture is condensed into dewdrops and removed, whereby the absolute amount of moisture contained in the air is reduced.

Subsequently, air taken in through the bypass line 440 is mixed with the air cooled to the temperature not more than the dew-point temperature as above, and thus the temperature of air is regulated, for example, at 15° C. This air is introduced into the humidifier 430 and humidified to a predetermined humidity (for example, 40% to 50%).

The air regulated at the predetermined humidity (40% to 50%) is sent out of the control unit 400' by the blower 435, flows through the air supply line 500 and moreover through the pipeline 460, and is supplied to the warming unit 470. On this occasion, since the air supply line 500 is not coated with a heat insulating material and is structured to be able to perform heat exchange, air flowing through this air supply line 500 exchanges heat with outside air, and thus the air is warmed. Specifically, air with a temperature of 15° C. sent out of the control unit 400', for example, absorbs the heat of outside air with a temperature of 23° C. and rises in temperature, and is warmed up to almost 20° C. in front of the warming unit 470.

This air is regulated at a preset air temperature in the coating processing unit (COT) by being warmed by the warming unit 470, and then blown out into the coating processing unit (COT) through the ULPA filter of the filter unit 480.

Since the air supply line 500 is structured to allow heat exchange in this embodiment as described above, air flowing through the air supply line 500 can be warmed by outside air. Consequently, energy required for warming air to a predetermined temperature can be reduced, and conventional warming equipment used up to this time in the control unit can be omitted, which leads to simplification of equipment and a reduction in running cost for electric power consumption and the like. Air which is warmed up roughly by the air supply line 500 is warmed up to a preset temperature by the warming unit 470 in the coating processing unit (COT), and thus the final fine control of temperature is performed, whereby air of which the temperature and humidity are controlled precisely can be supplied to the coating processing unit (COT).

Figure 15:
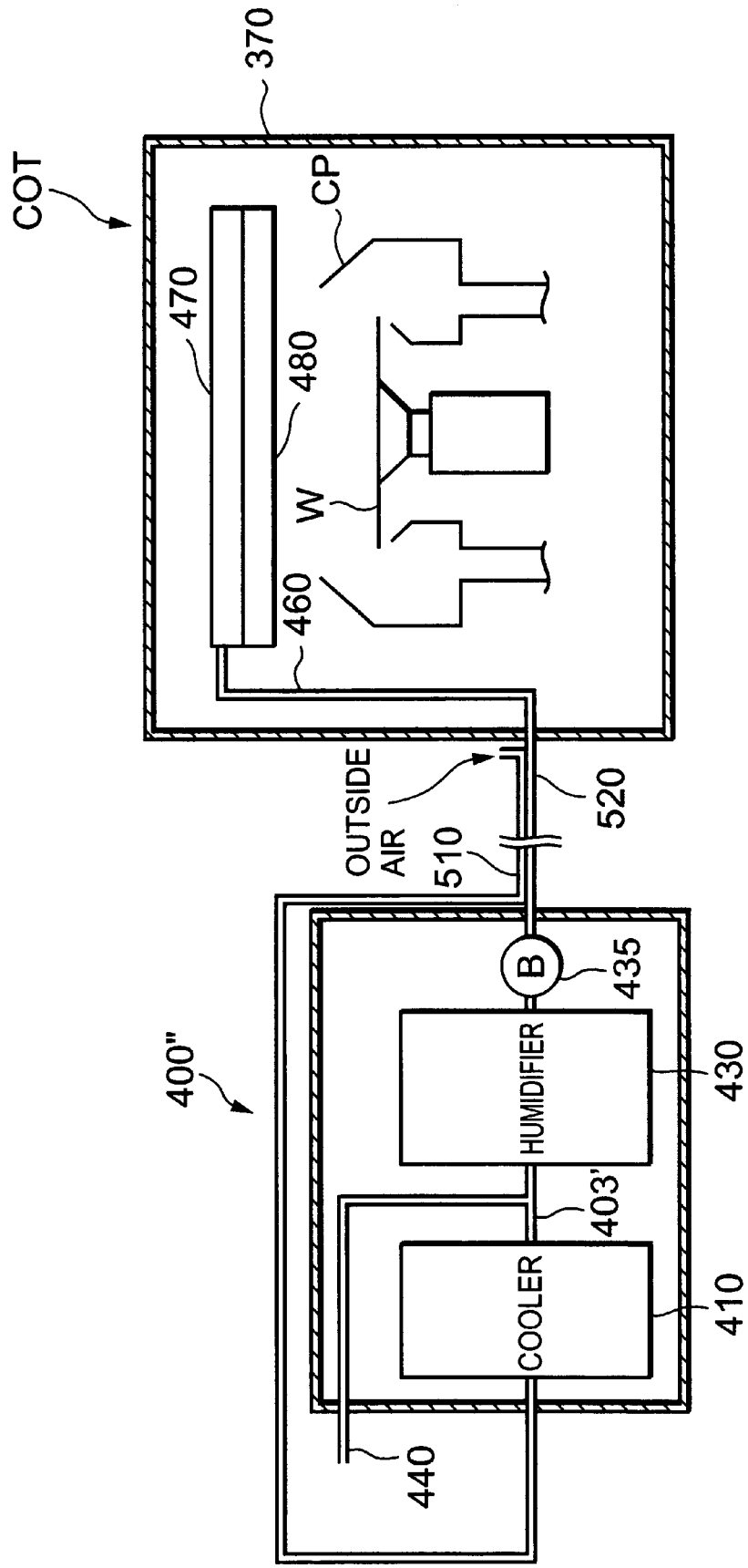
FIG. 15 is a sectional view showing a temperature and humidity controlling mechanism used in an eighth embodiment.

Next, still another embodiment of a temperature and humidity controlling mechanism for air to be sent to the coating processing unit (COT) will be explained with reference to FIG. 15. In this embodiment, heat exchange can be performed between an outside air intake line 510 for taking in outside air and a supply line 520 for supplying air from the control unit to the coating processing unit, and hence cooling energy of the cooler in the control unit can be reduced, and a warmer in the control unit can be omitted.

Namely, a control unit 400" includes the cooler 410, the humidifier 430, and the blower 435. The outside air intake line 510 for taking in outside air is connected to the cooler 410, has an outside air intake port near the casing 370 of the coating processing unit (COT), and is provided so as to touch the air supply line 520 situated between the control unit 400" and the coating processing unit (COT). Thus, heat exchange occurs between outside air flowing through the outside air intake line 510 and air sent out of the control unit 400" and flowing through the air supply line 520, and as a result, the outside air to be taken into the cooler 410 is cooled, and air to be supplied to the warming unit 470 after flowing through the air supply line 520 is warmed. In this case, the air supply line 520 functions as a warmer, whereby a warmer in the control unit 400" can be omitted.

Incidentally, in order that heat exchange can be performed between the outside air intake line 510 and the air supply line 520, the outside intake line 510 and the air supply line 520 can be formed by providing a partition in one line, in addition to provide these two lines so that they touch each other as shown in the illustration.

When the temperature and humidity of air to be supplied to the coating processing unit (COT) are controlled by the temperature and humidity controlling mechanism structured as above, outside air is first taken in by the outside air intake line 510 and sent to the cooler 410. At this time, heat is exchanged between the outside air (for example, 23° C.)

taken in by the outside air intake line 510 and air (for example, 15° C.) sent out of the control unit 400" and flowing through the air supply line 520, and hence the temperature of the outside air is lowered when being taken into the cooler 410. More specifically, when the temperature of the outside air is 23° C. and the temperature of air flowing through the air supply line 520 is 15° C., the air taken in is cooled to approximately 20° C. As a result, cooling energy of the cooler 410 can be reduced.

Meanwhile, in the cooler 410, the outside air taken in is cooled to a temperature (for example, 7° C.) not more than the dew-point temperature. On this occasion, the relative humidity is almost 100%, and supersaturated moisture is condensed into dewdrops and removed, whereby the absolute amount of moisture contained in the air is reduced.

Subsequently, air taken in through the bypass line 440 is mixed with the air cooled to the temperature not more than the dew-point temperature as above, and thus the temperature of air is regulated, for example, at 15° C. This air is introduced into the humidifier 430 and humidified to a predetermined humidity (for example, 40% to 50%).

The air regulated at the predetermined humidity (40% to 50%) is sent out of the control unit 400" by the blower 435, flows through the air supply line 520 and moreover through the pipeline 460, and is supplied to the warming unit 470. On this occasion, since the air supply line 520 and the outside air intake line 510 touch each other so that heat exchange can be performed between them, air flowing through this air supply line 520 exchanges heat with outside air flowing through the outside air intake line 510, and thus the air is warmed. Specifically, air with a temperature of 15° C. sent out of the control unit 400", for example, absorbs the heat of outside air with a temperature of 23° C. and rises in temperature, and is warmed up to approximately 20° C. in front of the warming unit 470.

This air is regulated at a preset air temperature in the coating processing unit (COT) by being warmed by the warming unit 470, and blown out into the coating processing unit (COT) through the ULPA filter of the filter unit 480.

The outside air intake line 510 and the air supply line 520 touch each other so that heat can be exchanged between them as described above, whereby heat is supplied from outside air flowing through the outside air intake line 510 while air of which the humidity is controlled by the control unit 400" is flowing through the air supply line 520. Thus, the temperature of air to be supplied to the warming unit 470 can be raised, whereas the heat of the outside air flowing through the outside air intake line 510 is absorbed by the air flowing through the air supply line and the temperature of the outside air to be supplied to the cooler 410 of the control unit 400" can be lowered. Accordingly, energy required for warming air to a predetermined temperature can be reduced, warming equipment in the control unit 400" can be omitted, and energy necessary for cooling outside air in the cooler 410 can be reduced, resulting in simplification of equipment and a reduction in running cost for electric power consumption and the like. The final fine control of temperature is performed by warming up air, which is warmed roughly by the air supply line 520, by the warming unit 470 provided in the coating processing unit (COT), whereby air of which the temperature and humidity are controlled precisely can be supplied to the coating processing unit (COT).

In the sixth to eighth embodiments, the warming unit 470 is provided inside the resist coating processing unit, but it may be provided near the resist coating processing unit. Furthermore, when in-plane temperature distribution of the wafer to be processed in the resist coating processing unit is ununiform, a mechanism for regulating temperature distribution of the warming unit 470 or a mechanism for regulating flow velocity distribution of air to be supplied to the wafer can be provided so as to make the in-plane temperature distribution uniform.

Moreover, when a plurality of resist coating processing units are disposed in the same resist coating and developing processing system, and processing temperatures and humidities in the respective resist coating processing units are different in the sixth to eighth embodiments, it is recommended that temperature conditions and humidity conditions be set in each of the resist coating processing units.

Although the case where the present invention is applied to the resist coating and developing processing system for semiconductor wafers is explained in the sixth to eighth embodiments, not limited to this, the present invention can be applied to any processing apparatus which requires temperature and humidity control. Moreover, the sixth to eighth embodiments and the first to fifth embodiments can be combined.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
   a coating processing unit for applying a resist solution to a substrate;
   a developing processing unit for performing developing processing for the substrate after the applied resist film is exposed;
   a cooling section for cooling outside air taken in from the outside to a predetermined temperature;
   a heat exchanger having a low temperature side flow path for letting the air cooled in said cooling section flow and a high temperature side flow path for letting outside air flow, and allowing heat exchange to be performed between the cooled air and the outside air;
   a warming and humidifying section for warming and humidifying the air flowing through the low temperature side flow path in said heat exchanger and warmed by the outside air flowing through the high temperature side flow path, and supplying the air with predetermined temperature and humidity to said coating processing unit; and
   a warming section for warming the outside air flowing through the high temperature side flow path in said heat exchanger and cooled by the air flowing through the low temperature side flow path, and supplying the air with a predetermined temperature to said developing processing unit.

2. The apparatus as set forth in claim 1, wherein said heat exchanger is any one of a cross flow-type, a heat pipe-type, and a shell and tube-type heat exchanger.

3. The apparatus as set forth in claim 1, wherein a supply line for supplying the air flowing through the low temperature side flow path in said heat exchanger and warmed and humidified by said warming and humidifying section to said coating processing unit, and a supply line for supplying the air flowing through the high temperature side flow path in said heat exchanger and warmed by said warming section to said developing processing unit are disposed separately.

4. A substrate processing apparatus, comprising:

a first processing unit for processing a substrate;

a second processing unit for processing the substrate;

a cooling section for cooling outside air taken in from the outside to a predetermined temperature;

a heat exchanger having a low temperature side flow path for letting the air cooled in said cooling section flow and a high temperature side flow path for letting outside air flow, and allowing heat exchange to be performed between the cooled air and the outside air;

a warming and humidifying section for warming and humidifying the air flowing through the low temperature side flow path in said heat exchanger and warmed by the outside air flowing through the high temperature side flow path, and supplying the air with predetermined temperature and humidity to said first processing unit; and a warming section for warming the outside air flowing through the high temperature side flow path in said heat exchanger and cooled by the air flowing through the low temperature side flow path, and supplying the air with a predetermined temperature to said second processing unit.

5. The apparatus as set forth in claim 4, wherein said first processing unit is a unit for applying a resist solution to the substrate.

6. The apparatus as set forth in claim 4, wherein said heat exchanger is any one of a cross flow-type, a heat pipe-type, and a shell and tube-type heat exchanger.

7. The apparatus as set forth in claim 4, wherein a supply line for supplying the air flowing through the low temperature side flow path in said heat exchanger and warmed and humidified by said warming and humidifying section to said first processing unit, and a supply line for supplying the air flowing through the high temperature side flow path in said heat exchanger and warmed by said warming section to said second processing unit are disposed separately.

8. A substrate processing apparatus, comprising:

a first processing unit for processing a substrate;

a second processing unit for processing the substrate;

a cooling section for cooling air exhausted from said first processing unit to a predetermined temperature;

a heat exchanger having a low temperature side flow path for letting the air cooled in said cooling section flow and a high temperature side flow path for letting air exhausted from said second processing unit flow, and allowing heat exchange to be performed between the cooled air and the air exhausted from said second processing unit;

a warming and humidifying section for warming and humidifying the air flowing through the low temperature side flow path in said heat exchanger and warmed by the air exhausted from said second processing unit and flowing through the high temperature side flow path, and supplying the air with predetermined temperature and humidity to said first processing unit; and a warming section for warming the air exhausted from said second processing unit which is flowing through the high temperature side flow path in said heat exchanger and cooled by the air flowing through the low temperature side flow path, and supplying the air with a predetermined temperature to said second processing unit.

9. The apparatus as set forth in claim 8, wherein said first processing unit is a unit for applying a resist solution to the substrate.

10. The apparatus as set forth in claim 8, wherein said second processing unit is a unit for performing developing processing for the substrate after the applied resist film is exposed.

11. The apparatus as set forth in claim 9, further comprising:

a filter for removing an ammonia component in the air exhausted from said second processing unit.

12. The apparatus as set forth in claim 8, wherein said heat exchanger is any one of a cross flow-type, a heat pipe-type, and a shell and tube-type heat exchanger.

13. The apparatus as set forth in claim 8, wherein a supply line for supplying the air flowing through the low temperature side flow path in said heat exchanger and warmed and humidified by said warming and humidifying section to said first processing unit, and a supply line for supplying the air flowing through the high temperature side flow path in said heat exchanger and warmed by said warming section to said second processing unit are disposed separately.

14. A substrate processing apparatus, comprising:

a processing unit that performs predetermined processing for a substrate;

a control unit that takes in outside air and controls the outside air taken in at a temperature lower than a preset air temperature in said processing unit and at a predetermined humidity; and a warming unit, provided in or near said processing unit, that warms the air, the temperature and humidity of which are controlled by said control unit, to a predetermined temperature and supplies the air with the predetermined temperature and the predetermined humidity into said processing unit;

wherein said control unit includes:

a cooler that cools the outside air taken in to a temperature not more than a dew-point temperature;

a warmer that warms the cooled air to a temperature lower than the temperature of air to be supplied to said processing unit; and a humidifier that humidifies the warmed air to a predetermined humidity.

15. The apparatus as set forth in claim 14, wherein said control unit includes a bypass pipe that mixes the air cooled by said cooler with outside air.

16. A substrate processing apparatus, comprising:

a processing unit for performing predetermined processing for a substrate;

a control unit for taking in outside air, temporarily cooling the outside air taken in, and thereafter controlling the outside air to a predetermined humidity;

an air supply line, structured to allow air flowing through therein and outside air to perform heat exchange, for supplying the air of which the humidity is controlled by said control unit to said processing unit; and a warming unit, connected to said air supply line and provided in or near said processing unit, for warming the air of which the humidity is controlled by said control unit to a predetermined temperature and supplying it into said processing unit, said air supply line increasing the temperature of air to be supplied from said control unit to said warming unit by performing heat exchange between the air and outside air.

17. The apparatus as set forth in claim 16, wherein said control unit includes:
- a cooler for cooling the outside air introduced from said outside air introducing line to a temperature not more than a dew-point temperature;
- a bypass pipe for mixing the cooled air with outside air; and
- a humidifier for humidifying the mixed air to a predetermined humidity.

18. A substrate processing apparatus, comprising:

a processing unit for performing predetermined processing for a substrate;

a control unit for taking in outside air, temporarily cooling the outside air taken in, and thereafter controlling the outside air to a predetermined humidity;

an outside air introducing line for introducing outside air into said control unit;

an air supply line for supplying the air controlled by said control unit to said processing unit; and a warming unit, connected to said air supply line and provided in or near said processing unit, for warming the air of which the humidity is controlled by said control unit to a predetermined temperature and supplying it into said processing unit, said outside air introducing line and said air supply line being disposed so that at least parts of them allow heat exchange between them.

19. The apparatus as set forth claim 18, wherein said outside air introducing line and said air supply line are disposed so that at least parts of them touch each other.

* * * * *